US008889532B2

(12) United States Patent
Burke et al.

(10) Patent No.: US 8,889,532 B2
(45) Date of Patent: Nov. 18, 2014

(54) METHOD OF MAKING AN INSULATED GATE SEMICONDUCTOR DEVICE AND STRUCTURE

(75) Inventors: Peter A. Burke, Portland, OR (US); Gordon M. Grivna, Mesa, AZ (US); Balaji Padmanabhan, Tempe, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 541 days.

(21) Appl. No.: 13/170,033

(22) Filed: Jun. 27, 2011

(65) Prior Publication Data

US 2012/0326227 A1    Dec. 27, 2012

(51) Int. Cl.

| *H01L 21/36* | (2006.01) |
|---|---|
| *H01L 21/20* | (2006.01) |
| *H01L 21/336* | (2006.01) |
| *H01L 29/66* | (2006.01) |
| *H01L 29/40* | (2006.01) |
| *H01L 29/78* | (2006.01) |
| *H01L 29/739* | (2006.01) |
| *H01L 29/08* | (2006.01) |
| *H01L 29/45* | (2006.01) |
| *H01L 29/417* | (2006.01) |
| *H01L 29/49* | (2006.01) |
| *H01L 29/423* | (2006.01) |

(52) U.S. Cl.
CPC ....... *H01L 29/66348* (2013.01); *H01L 29/0869* (2013.01); *H01L 29/456* (2013.01); *H01L 29/66719* (2013.01); *H01L 29/41766* (2013.01); *H01L 29/407* (2013.01); *H01L 29/66734* (2013.01); *H01L 29/4933* (2013.01); *H01L 29/66727* (2013.01); *H01L 29/7813* (2013.01); *H01L 29/4236* (2013.01); *H01L 29/7811* (2013.01); *H01L 29/7397* (2013.01)
USPC ........... 438/489; 438/270; 438/259; 438/271; 257/330; 257/332; 257/401; 257/E29.257; 257/E29.2

(58) Field of Classification Search
CPC ............ H01L 29/407; H01L 29/66734; H01L 29/7813; H01L 29/42368; H01L 21/28; H01L 29/78; H01L 29/423; H01L 29/41766; H01L 29/513; H01L 29/66727; H01L 29/4236; H01L 29/66719; H01L 29/402; H01L 29/512; H01L 29/66348
USPC ......... 257/330, E21.41, E29.257, 332, E29.2, 257/401; 438/270, 272, 589, 259, 271
See application file for complete search history.

(56) References Cited

U.S. PATENT DOCUMENTS

| 5,973,360 | A | 10/1999 | Tihanyi |  |
|---|---|---|---|---|
| 6,365,462 | B2 | 4/2002 | Baliga |  |
| 7,633,119 | B2 * | 12/2009 | Bhalla et al. | 257/330 |
| 7,872,305 | B2 * | 1/2011 | Hunt | 257/330 |
| 7,936,009 | B2 * | 5/2011 | Pan et al. | 257/330 |
| 8,497,549 | B2 * | 7/2013 | Madson | 257/330 |

(Continued)

*Primary Examiner* — Chuong A Luu
*Assistant Examiner* — Cory Eskridge
(74) *Attorney, Agent, or Firm* — Kevin B. Jackson

(57) ABSTRACT

In one embodiment, a vertical insulated-gate field effect transistor includes a shield electrode formed in trench structure within a semiconductor material. A gate electrode is isolated from the semiconductor material using gate insulating layers. Before the shield electrode is formed, spacer layers can be used form shield insulating layers along portions of the trench structure. The shield insulating layers are thicker than the gate insulating layers. In another embodiment, the shield insulating layers have variable thickness.

22 Claims, 24 Drawing Sheets

(56) References Cited

U.S. PATENT DOCUMENTS

2005/0145934 A1* 7/2005 Kocon et al. ................. 257/333
2009/0050959 A1* 2/2009 Madson ....................... 257/332
2010/0187602 A1 7/2010 Woolsey
2010/0264486 A1* 10/2010 Denison et al. ............... 257/330
2011/0031551 A1* 2/2011 Andrews ...................... 257/330

* cited by examiner

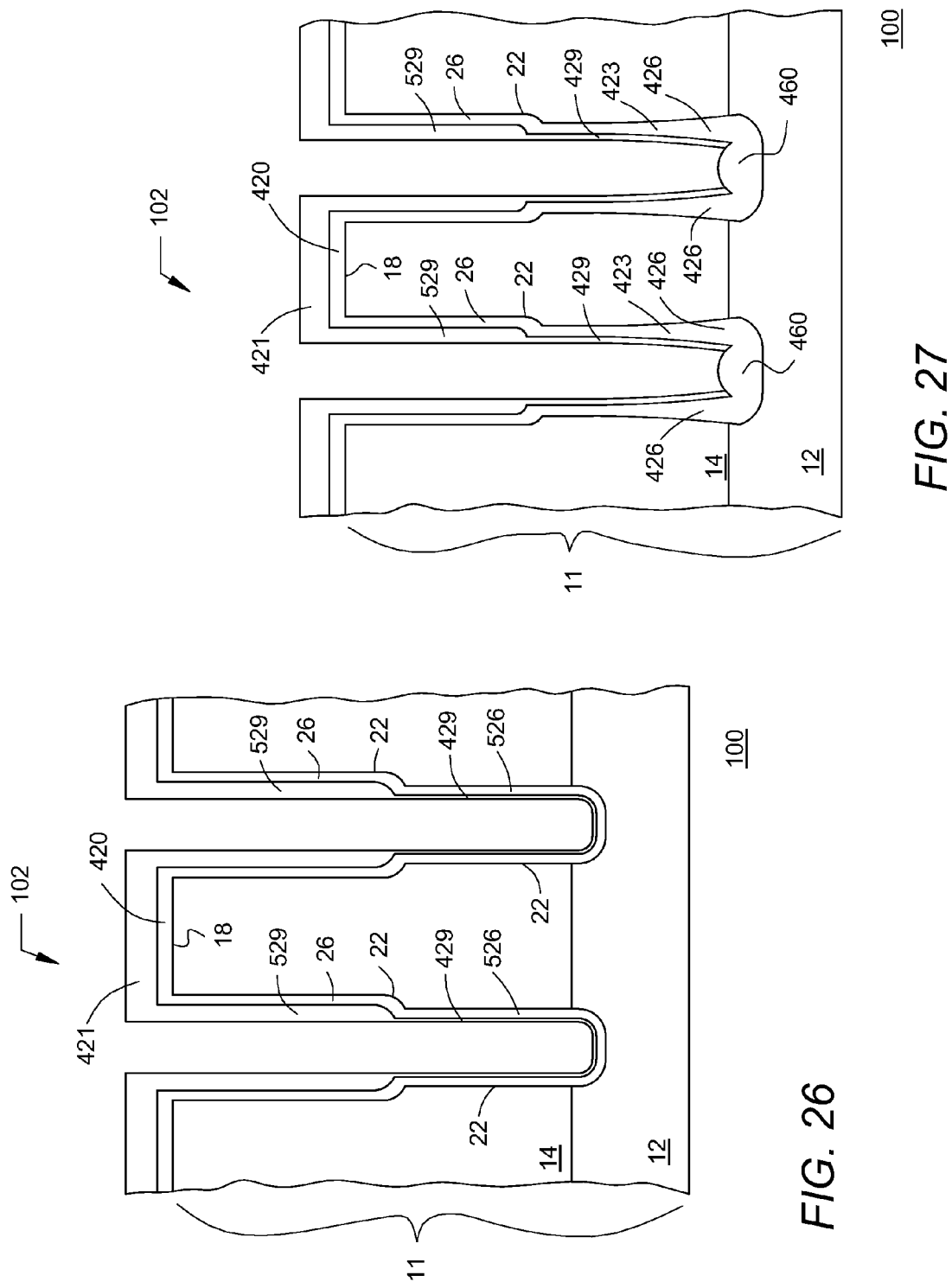

METHOD OF MAKING AN INSULATED GATE SEMICONDUCTOR DEVICE AND STRUCTURE

BACKGROUND OF THE INVENTION

This document relates generally to semiconductor devices, and more specifically to methods of forming insulated gate devices and structures.

Metal oxide field effect semiconductor transistor (MOSFET) devices are used in many power switching applications such as dc-dc converters. In a typical MOSFET, a gate electrode provides turn-on and turn-off control with the application of an appropriate gate voltage. By way of example, in an n-type enhancement mode MOSFET, turn-on occurs when a conductive n-type inversion layer (i.e., channel region) is formed in a p-type body region in response to the application of a positive gate voltage, which exceeds an inherent threshold voltage. The inversion layer connects n-type source regions to n-type drain regions and allows for majority carrier conduction between these regions.

There is a class of MOSFET devices in which the gate electrode is formed in a trench that extends downward from a major surface of a semiconductor material, such as silicon. Current flow in this class of devices is primarily vertical, and, as a result, device cells can be more densely packed. All else being equal, the more densely packed device cells increases the current carrying capability and reduces on-resistance of the device.

Achieving the lowest specific on-resistance (ohm-area), which is an important goal of MOSFET device designers, can determine product cost and gross margins or profitability. In particular, the low specific on-resistance allows for a smaller MOSFET die or chip, which in turn leads to lower costs in semiconductor materials and package structures. However, challenges continue to exist in designing and manufacturing high density MOSFET devices that achieve lower specific on-resistance, that have optimum switching performance, that support voltage scaling (i.e., support a range of drain-to-source breakdown voltage ($BV_{dss}$) requirements), and that are cost effective to manufacture.

Accordingly, methods and structures are needed for semiconductor devices that have lower specific on-resistance and optimum switching performance, that support voltage scaling, and that are cost effective to manufacture.

BRIEF DESCRIPTION OF THE DRAWINGS

FIGS. 24-27 illustrate partial cross-sectional views of the semiconductor device of FIG. 20 at various stages of fabrication in accordance with a further embodiment of the present invention.

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-channel devices, a person of ordinary skill in the art understands that P-channel devices and complementary devices are also possible in accordance with the present description. For clarity of the drawings, doped regions of device structures are illustrated as having generally straight-line edges and precise angular corners; however, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description may embody either a cellular base design (in which the body regions are a plurality of distinct and separate cellular or stripe regions) or a single base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompasses both a cellular base design and a single base design.

DETAILED DESCRIPTION OF THE DRAWINGS

Figure 1:
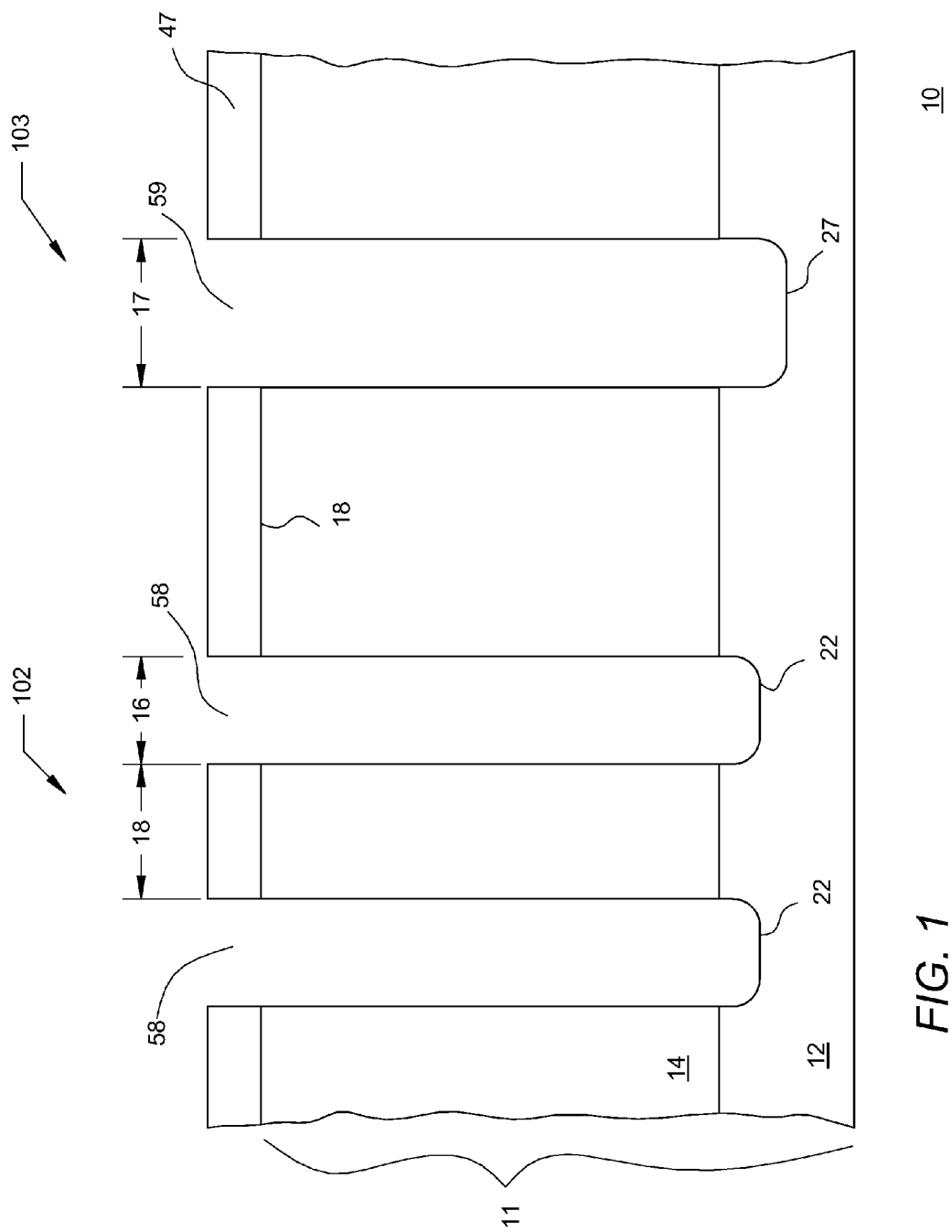
FIGS. 1-14 illustrate partial cross-sectional views of a semiconductor device at various stages of fabrication in accordance with a first embodiment of the present invention.

FIG. 1 shows a partial cross-sectional view of a semiconductor device 10 or cell 10 at an early stage of fabrication in accordance with a first embodiment. Device 10 includes a region of semiconductor material, semiconductor material, or semiconductor region 11, which can be, for example, an n-type silicon substrate 12 having a resistivity ranging from about 0.001 ohm-cm to about 0.005 ohm-cm. Substrate 12 can be doped with phosphorous or arsenic. In the embodiment shown, substrate 12 provides a drain region, drain contact, or a first current carrying contact for device 10. In this embodiment, device 10 can include an active area 102 and a contact area 103 where contact can be made, for example, to shield electrode structures described later. Also, in this embodiment, device 10 can be configured as a vertical power MOSFET structure, but this description applies as well to insulated gate bipolar transistors (IGBT), MOS-gated thyristors, and the like.

A semiconductor layer, drift region, or extended drain region 14 can be formed in, on, or overlying substrate 12. In one embodiment, semiconductor layer 14 can be formed using semiconductor epitaxial growth techniques. Alternatively, semiconductor layer 14 can be formed using semiconductor doping and diffusion techniques. In an embodiment suitable for a 50 volt device, semiconductor layer 14 can be n-type with a dopant concentration of about $1.0\times10^{16}$ to about $1.0\times10^{17}$ atoms/cm$^3$ and can have a thickness from about 3 microns to about 5 microns. The thickness and dopant concentration of semiconductor layer 14 can be increased or decreased depending on the desired drain-to-source breakdown voltage ($BV_{DSS}$) rating of device 10. In an alternate embodiment, the conductivity type of substrate 12 can be switched to be opposite to the conductivity type of semiconductor layer 14 to form, for example, an IGBT embodiment.

A masking layer 47 can be formed overlying a major surface 18 of region of semiconductor material 11. In one embodiment, masking layer 47 can comprise a dielectric film or a film resistant to the etch chemistries used to form the trenches described hereinafter. In one embodiment, masking layer 47 can comprise about 0.10 to about 0.30 microns of thermal oxide. Openings 58 and 59 can then be formed in masking layer 47. In one embodiment, photoresist and etch processes can be used to form openings 58 and 59. In one embodiment, openings 58 can have an initial width 16 of about 0.2 microns to about 0.25 microns, and openings 59 can have an initial width 17 of about 0.4 microns to about 0.5 microns. In one embodiment, an initial spacing 18 between openings 58 can be about 0.55 microns to about 0.65 microns.

After openings 58 and 59 are formed, segments of semiconductor layer 14 can be etched to form trenches 22 and 27 extending from major surface 18. By way of example, trenches 22 and 27 can be formed using plasma etching techniques with a fluorocarbon chemistry (e.g., $SF_6/O_2$). In one embodiment, trenches 22 and 27 can extend through semiconductor layer 14 and into substrate 12. In one embodiment, trenches 22 and 27 can extend partially into semiconductor layer 14.

Figure 2:
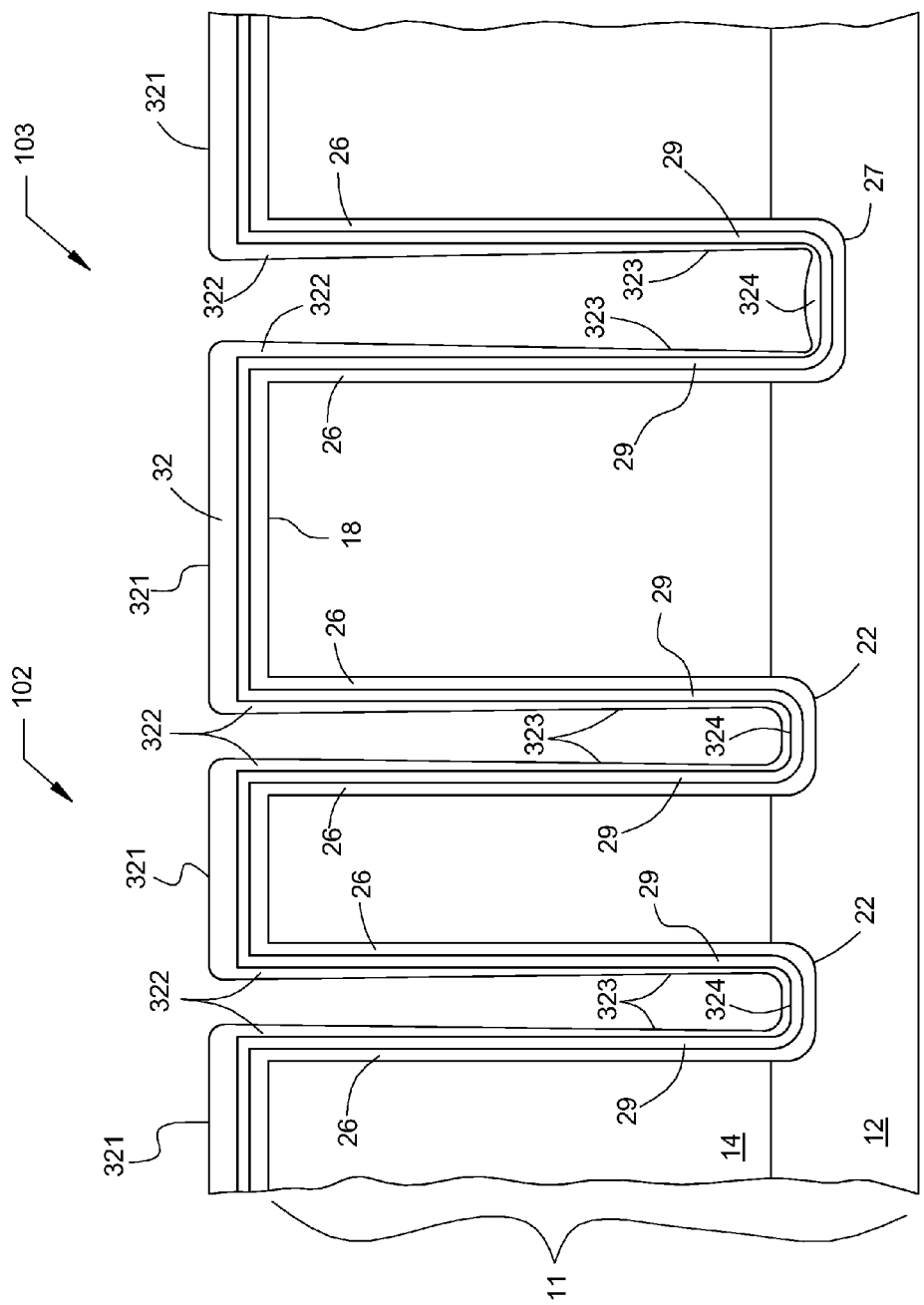

FIG. 2 is a partial cross-sectional view of device 10 after additional processing. In an optional step, a sacrificial layer (not shown) is formed adjoining surfaces of trenches 22 and 27. By way of example, a thermal silicon oxide layer is grown. Next, the sacrificial layer and masking layer 47 can be removed. In accordance with the present embodiment, a layer of material can then be formed overlying surfaces of trenches 22 and 27 and major surface 18, which forms gate layers 26 in trenches 22. By way of example, gate layers 26 typically comprise oxides, nitrides, tantalum pentoxide, titanium dioxide, barium strontium titanate, combinations thereof, or the like. In one embodiment, gate layers 26 can comprise silicon oxide and can have a thickness from about 0.01 microns to about 0.05 microns. Next, layer or layers of material 29 can be formed adjacent to gate layers 26. Layers 29 can comprise a material that is different than that of gate layers 26, and in one embodiment, layers 29 can comprise silicon nitride when gate layers 26 comprise silicon oxide. In view of the tight dimensions of widths 16 of trenches 22 and in one embodiment, layers 29 can be formed adjoining gate layers 26 without an intervening layer, such as a polysilicon layer. In one embodiment, layers 29 can have a thickness of about 0.01 microns to about 0.05 microns.

In a subsequent step, a non-conformal layer 32 can be formed adjacent to layers 29. Layer 32 includes portions 321 overlying major surface 18, portions 322 overlying upper sidewall portions of trenches 22 and 27, portions 323 overlying lower sidewall surfaces of trenches 22 and 27, and portions 324 overlying lower surfaces of trenches 22 and 27. To facilitate a subsequent process step, portions 321 and 322 can be thicker than portions 323 as shown in FIG. 2. In one embodiment, portions 321 and 322 reduce openings 58 to about 0.12 microns to about 0.18 microns. In one embodiment, layer 32 can comprise a deposited silicon oxide. In one embodiment, the deposited silicon oxide can be formed using plasma-enhanced chemical vapor deposition (PECVD) with a silane source gas.

Figure 3:
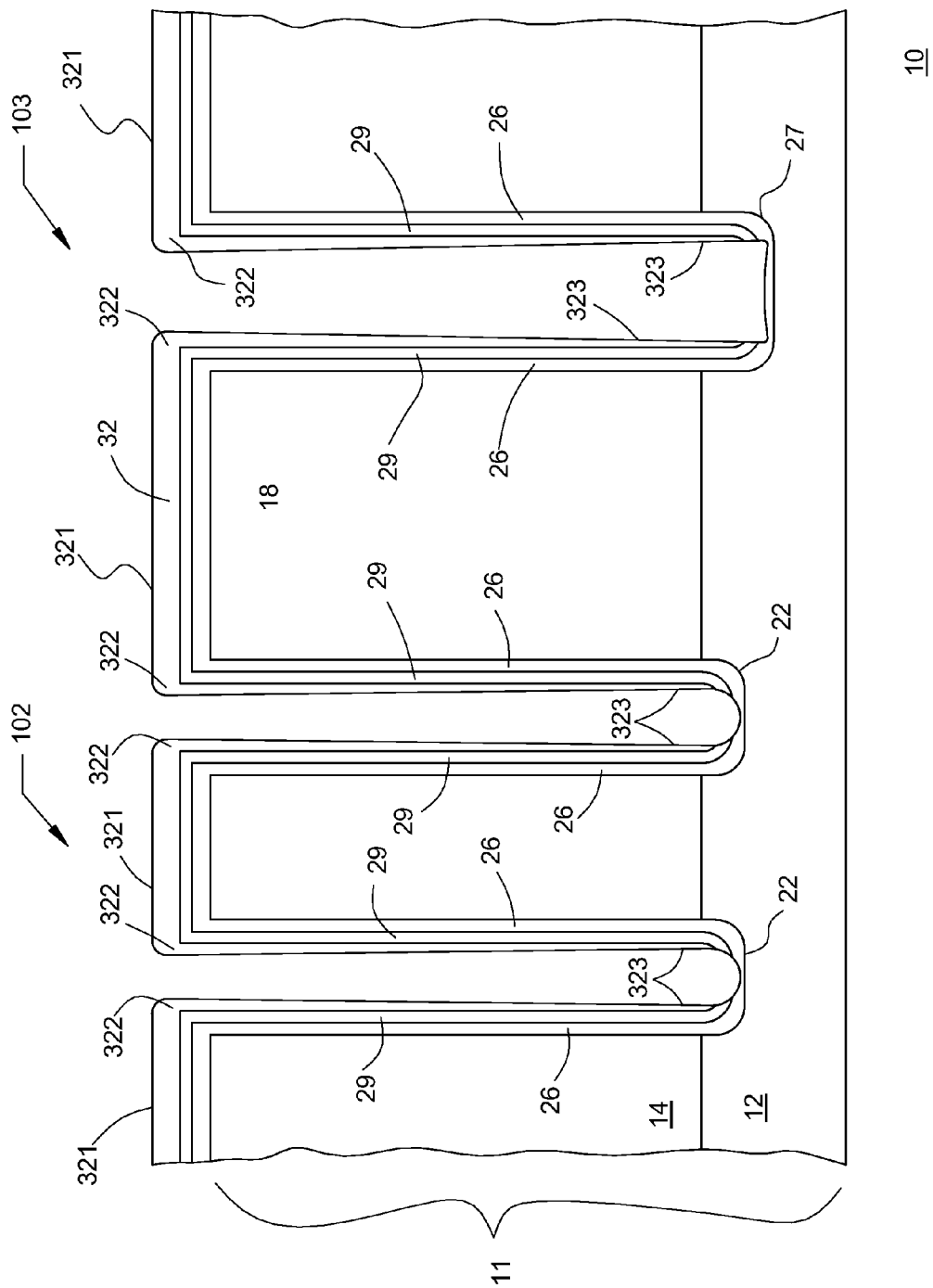

In a subsequent step, portions 324 and lower portions of layers 29 can be removed from trenches 22 and 27 as shown in FIG. 3. In one embodiment, a reactive ion etch (RIE) process can be used to remove such portions. By way of example, an $SF_6/O_2$-argon chemistry can be used for this step. In this removal step, portions 322 of layer 32 provide additional directional control for the reactive ions, which helps reduce any removal of layers 29 along the sidewalls of trenches 22 and 27. This process step can also thin portions 321 of layer 32.

Figure 4:
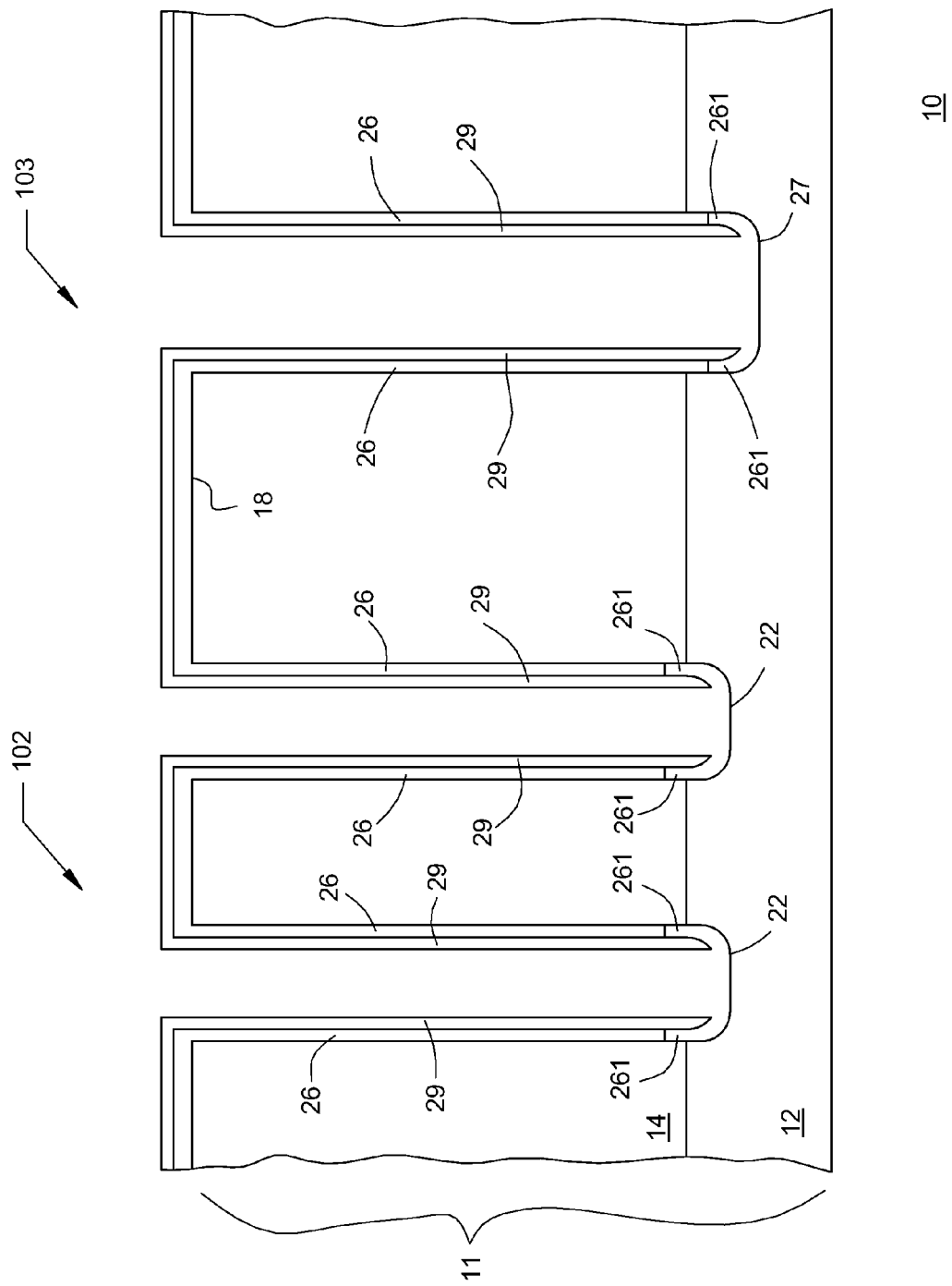

FIG. 4 is a partial cross-sectional view of device 10 after additional processing. A removal step is used to remove layer 32 overlying layers 29 and to remove portions of layers 26 along lower sidewall portions or/and lower portions of trenches 22 and 27. When layers 26 comprise silicon oxide, a wet etch process (e.g., diluted hydrofluoric (HF) acid) can be used for this step. In accordance with this embodiment, gaps or undercut portions 261 are formed between semiconductor layer 14 and layer 29. It is understood that the size of undercut portions 261 can be larger or smaller than what is shown in FIG. 4.

Figure 5:
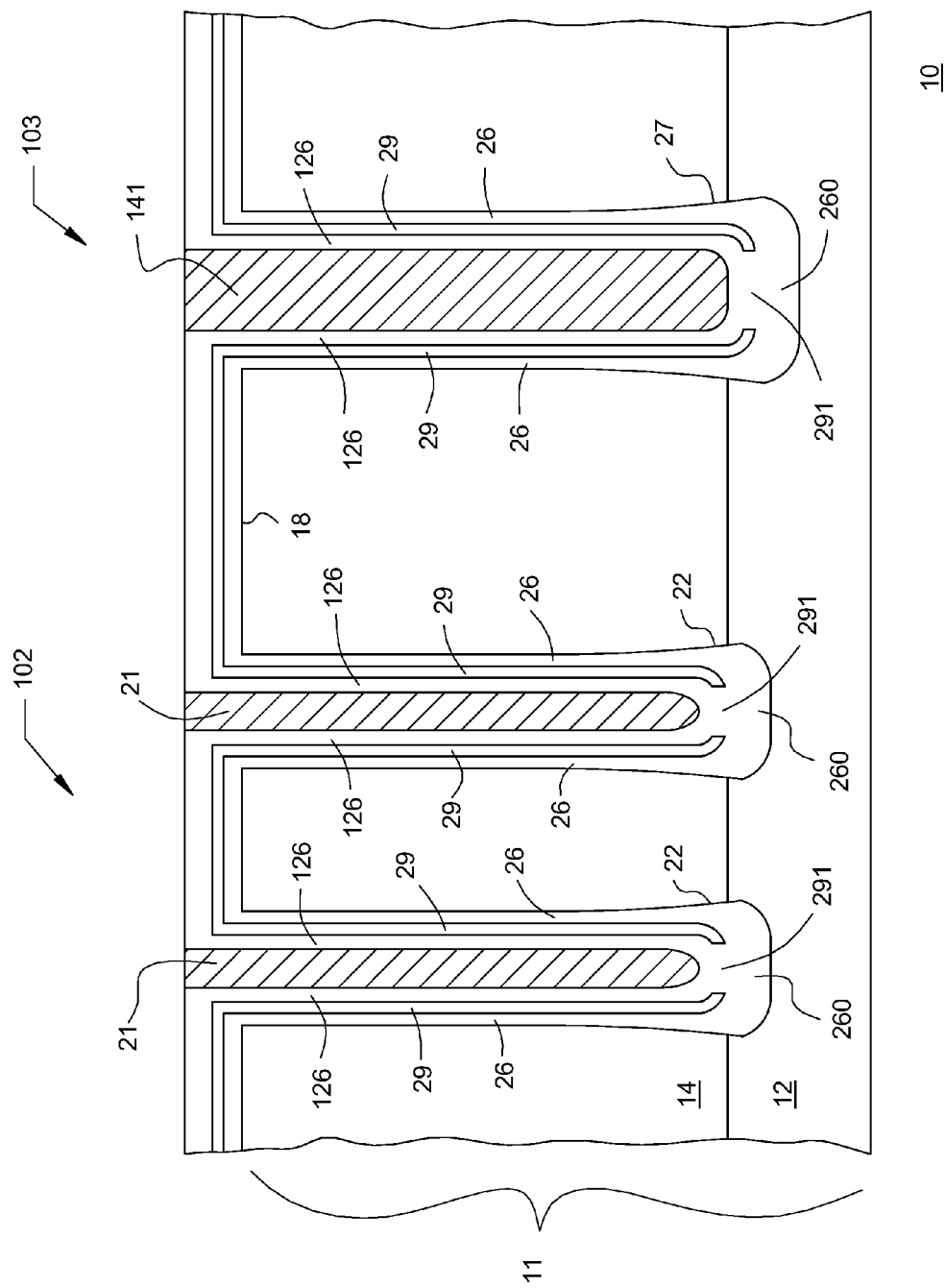

FIG. 5 is a partial cross-sectional view of device 10 at a later step in fabrication. Regions 260 of material are formed along lower portions or segments of trenches 22 and 27. In one embodiment, regions 260 can comprise dielectric materials. For example, regions 260 can comprise silicon oxide regions formed using wet oxide growth techniques. In one embodiment, regions 260 preferably are thicker than layers 26 are. By way of example, regions 260 have a thickness from about 0.1 microns to about 0.2 microns. In this embodiment, layers 29 in device 10 are discontinuous at lower portions of trenches 22 and 27 or are discontinuous adjacent to regions 260. Moreover, gaps 291 are formed between adjacent portions of layers 29 adjacent to lower portions of trenches 22 and 27 or regions 260.

Next, a layer 126 of material can be formed adjacent to layers 29 and regions 260 as shown in FIG. 5. In one embodiment, layer 126 can be a conformal layer of dielectric material, such as a conformal oxide. In one embodiment, layer 126 can comprise about 0.03 microns to about 0.05 microns of silicon oxide. In one embodiment, a high temperature silicon oxide that is densified can be used. A layer of polycrystalline semiconductor material is then formed overlying major surface 18 and within trenches 22 and 27. In one embodiment, the layer of polycrystalline material can comprise doped polysilicon. In one embodiment, the polysilicon can be doped with phosphorous. In a subsequent step, the layer of polycrystalline material can be planarized. In one embodiment, chemical mechanical polishing techniques can be used. The planarized material can then be heat treated. In one embodiment, the planarized material forms shield electrodes 21 and shield electrode contact 141 for device 10.

Figure 6:
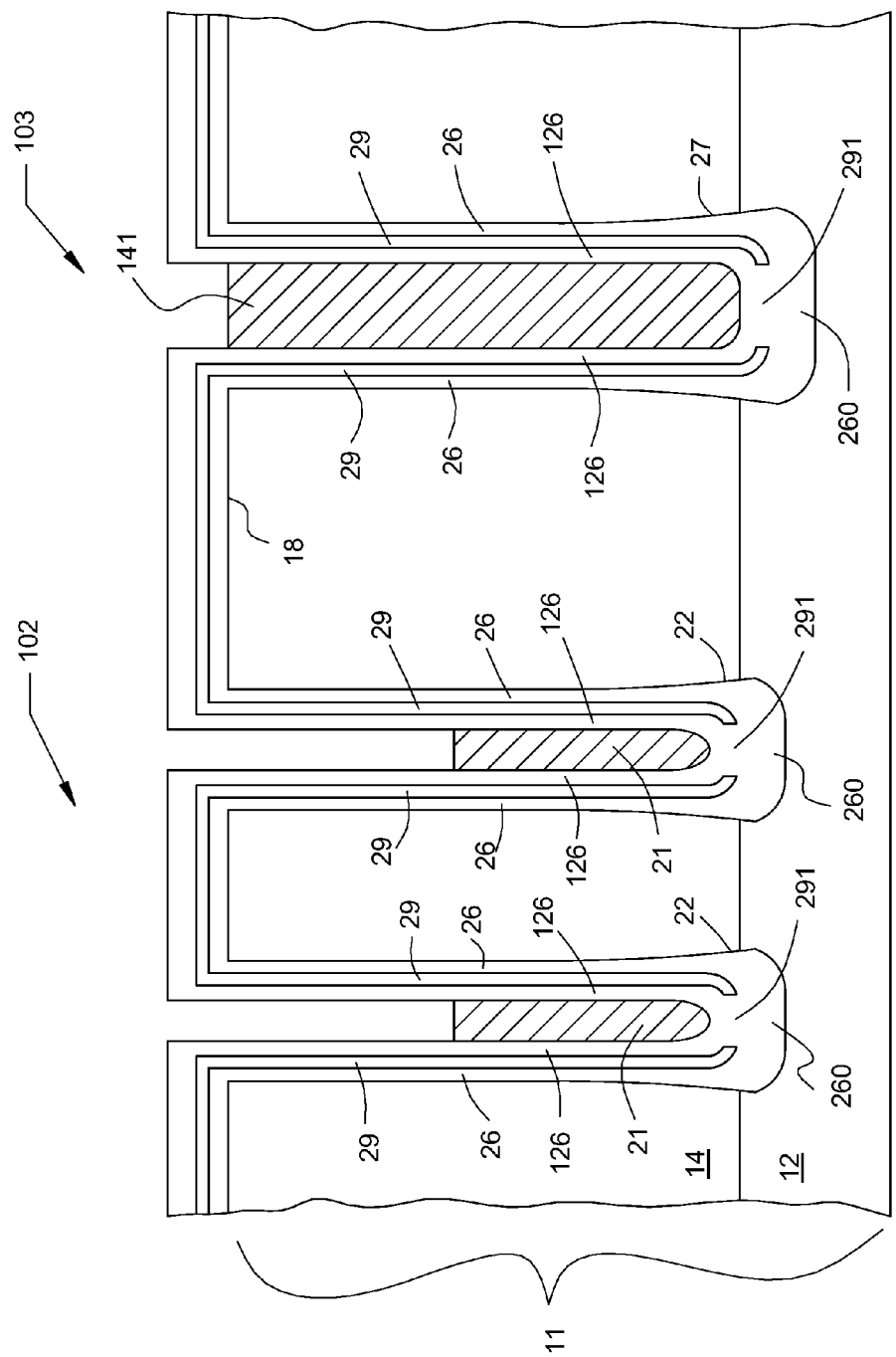

FIG. 6 is a partial cross-sectional view of device 10 after further processing. For example, the planarized material used to form shield electrodes 21 and shield electrode contact 141 is further removed to recess the material to a point in proximity to major surface 18. Next, a protective layer (not shown) is formed overlying contact area 103, and shield electrodes 21 are further recessed in trenches 22. As an example, a fluorine or chlorine based chemistry can be used for the recess steps. The protective layer can then be removed.

Figure 7:
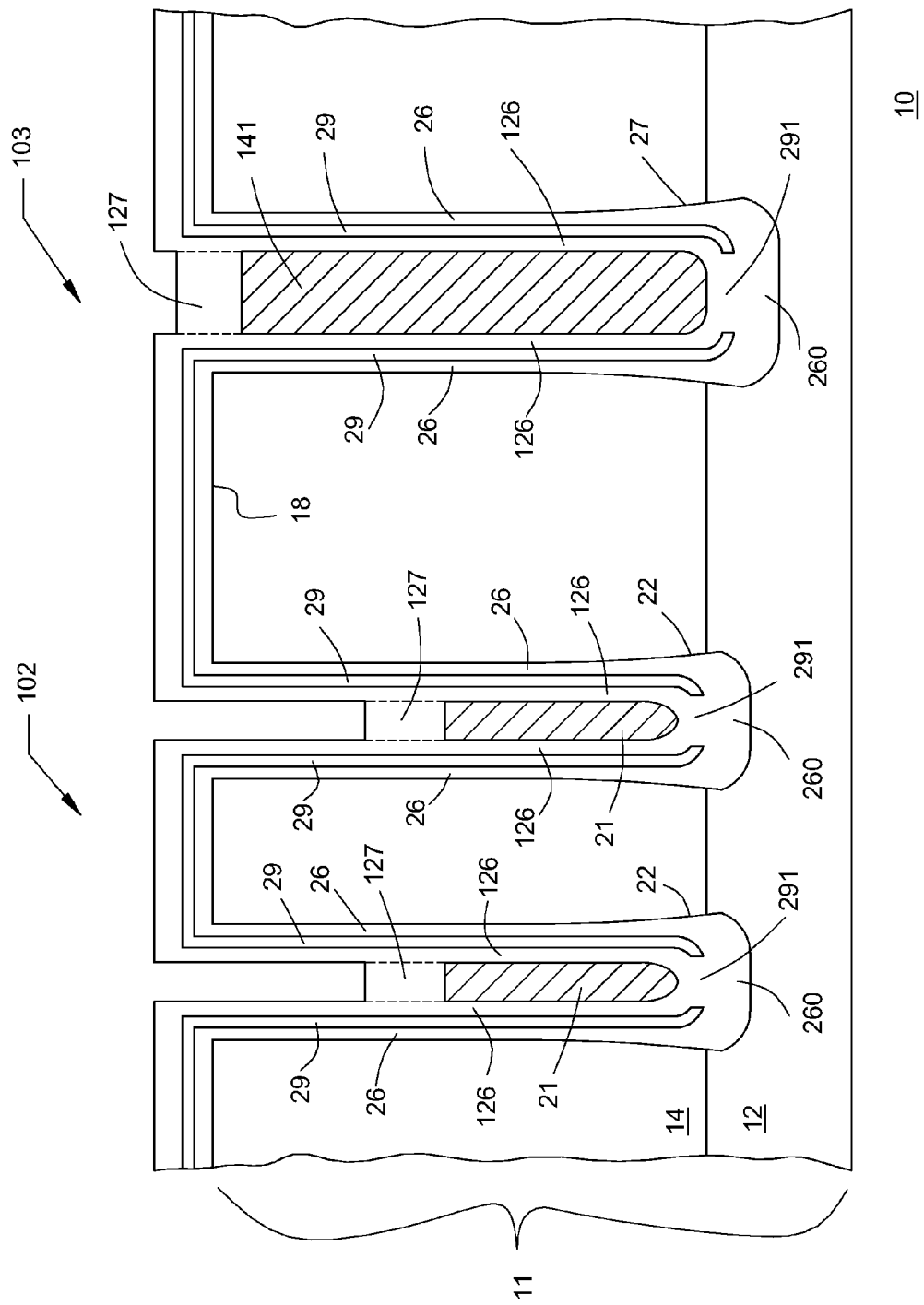
Figure 8:
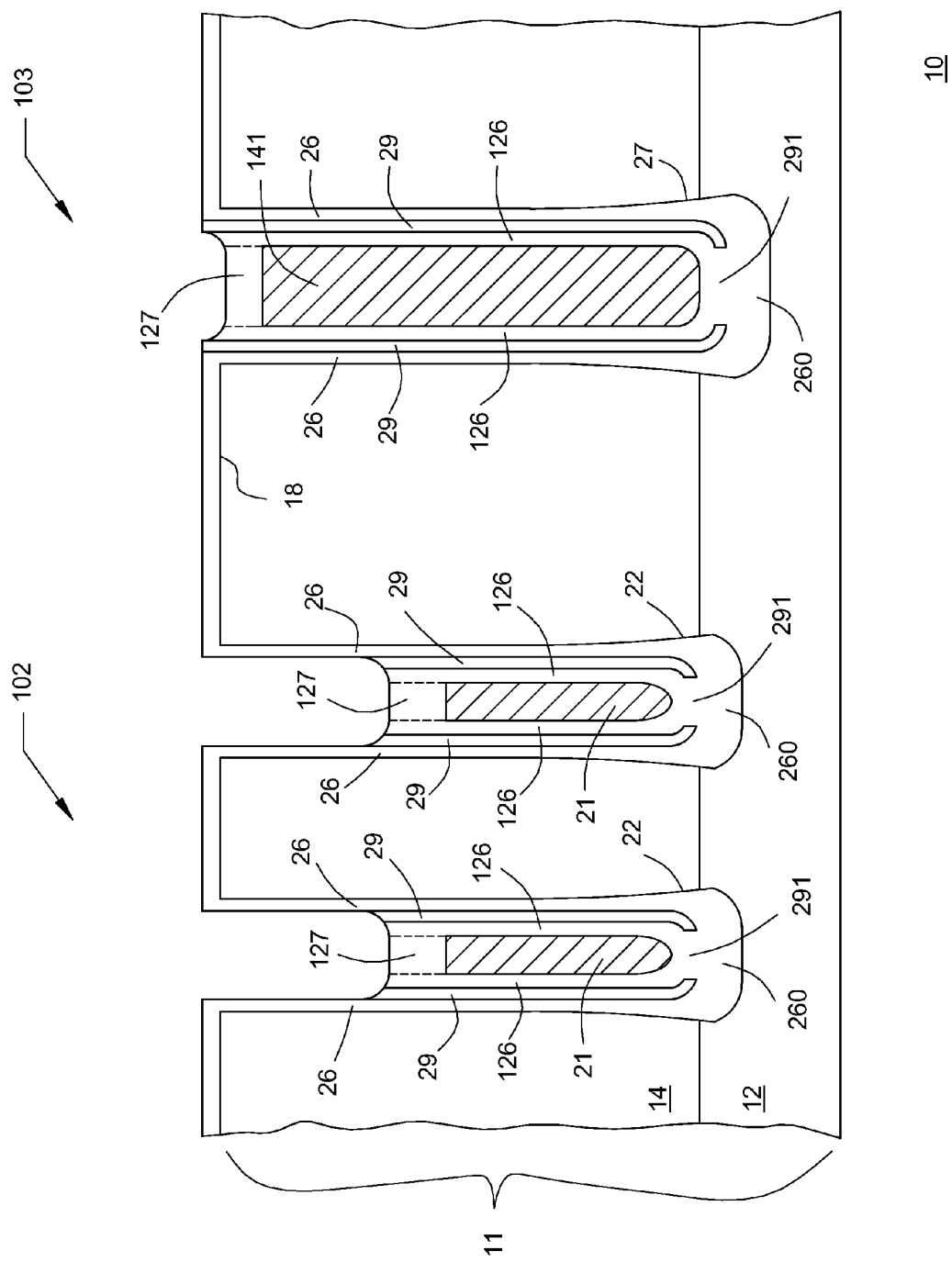

FIGS. 7-8 are partial cross-sectional views of device 10 in a sequence of process steps as one option that can be used to form an interlayer film overlying shield electrodes 21. A second option will be described in conjunction with FIGS. 9-11. Referring to FIG. 7, layers 127 can be formed overlying upper surfaces of shield electrodes 21 and shield electrode contact 141. In one embodiment, layers 127 can comprise dielectric material. In one embodiment, layers 127 can comprise a silicon oxide formed using wet oxidation techniques. In one embodiment, layers 127 can have a thickness from about 0.1 microns to about 0.3 microns. In subsequent steps, layers 126, exposed portions of layers 29, and portions of layers 127 are removed within trenches 22, and portions of layers 126, portions of layers 29, and portions of layer 127 are removed within trench 27 as shown in FIG. 8. In one embodiment, additional material can be added to layers 26. In one embodiment, a gate re-oxidation step can be used.

Figure 9:
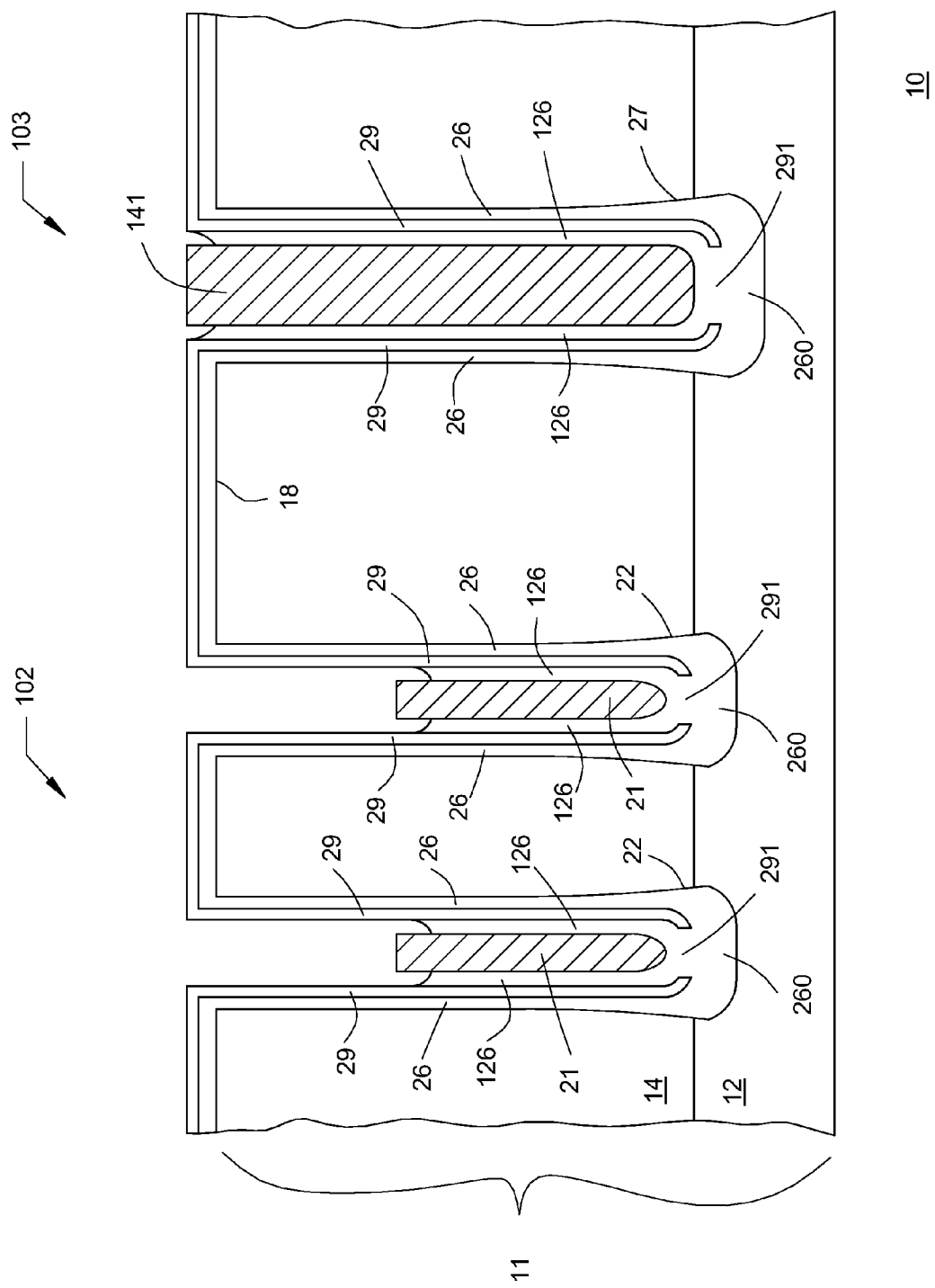
Figure 10:
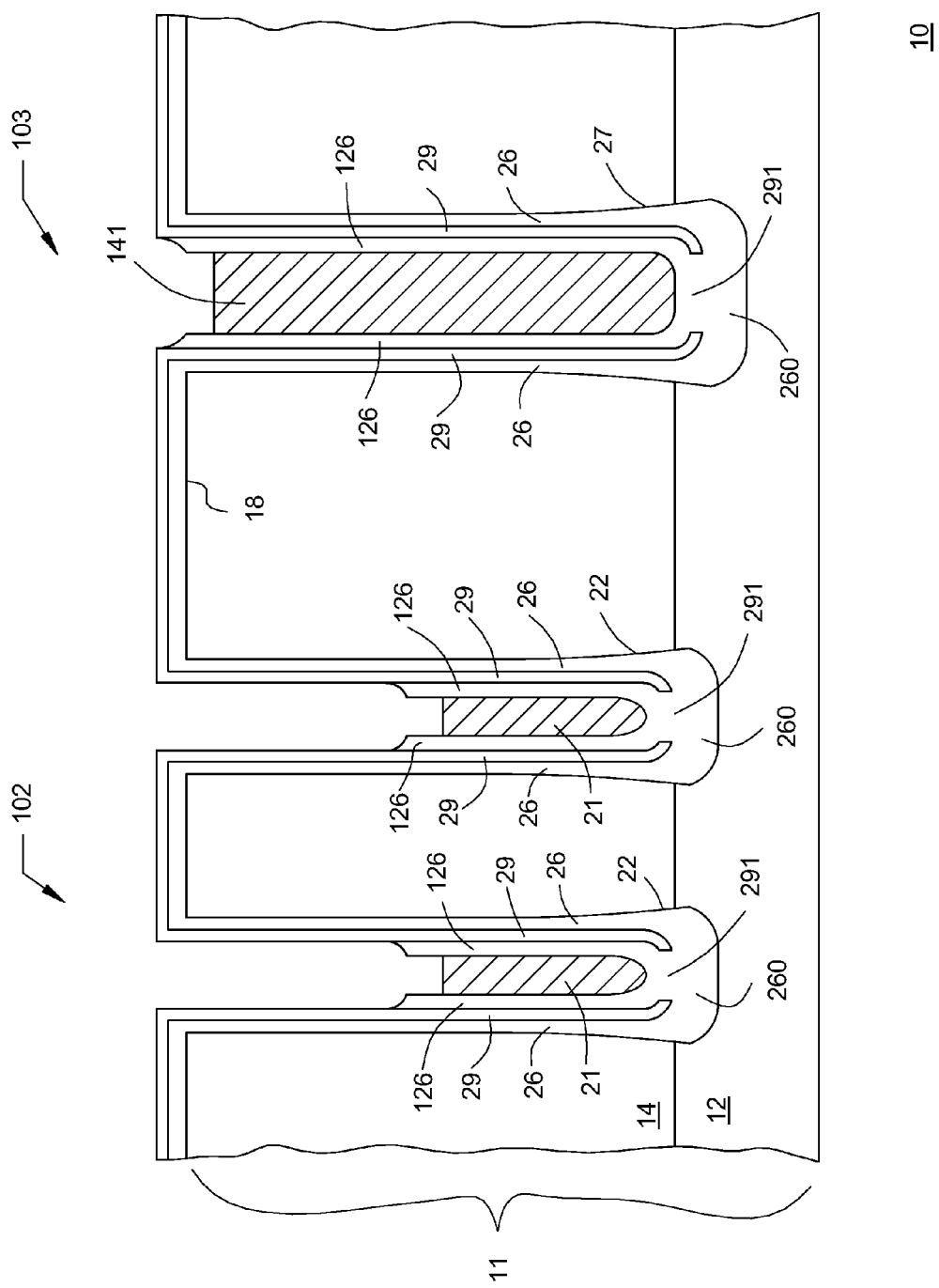
Figure 11:
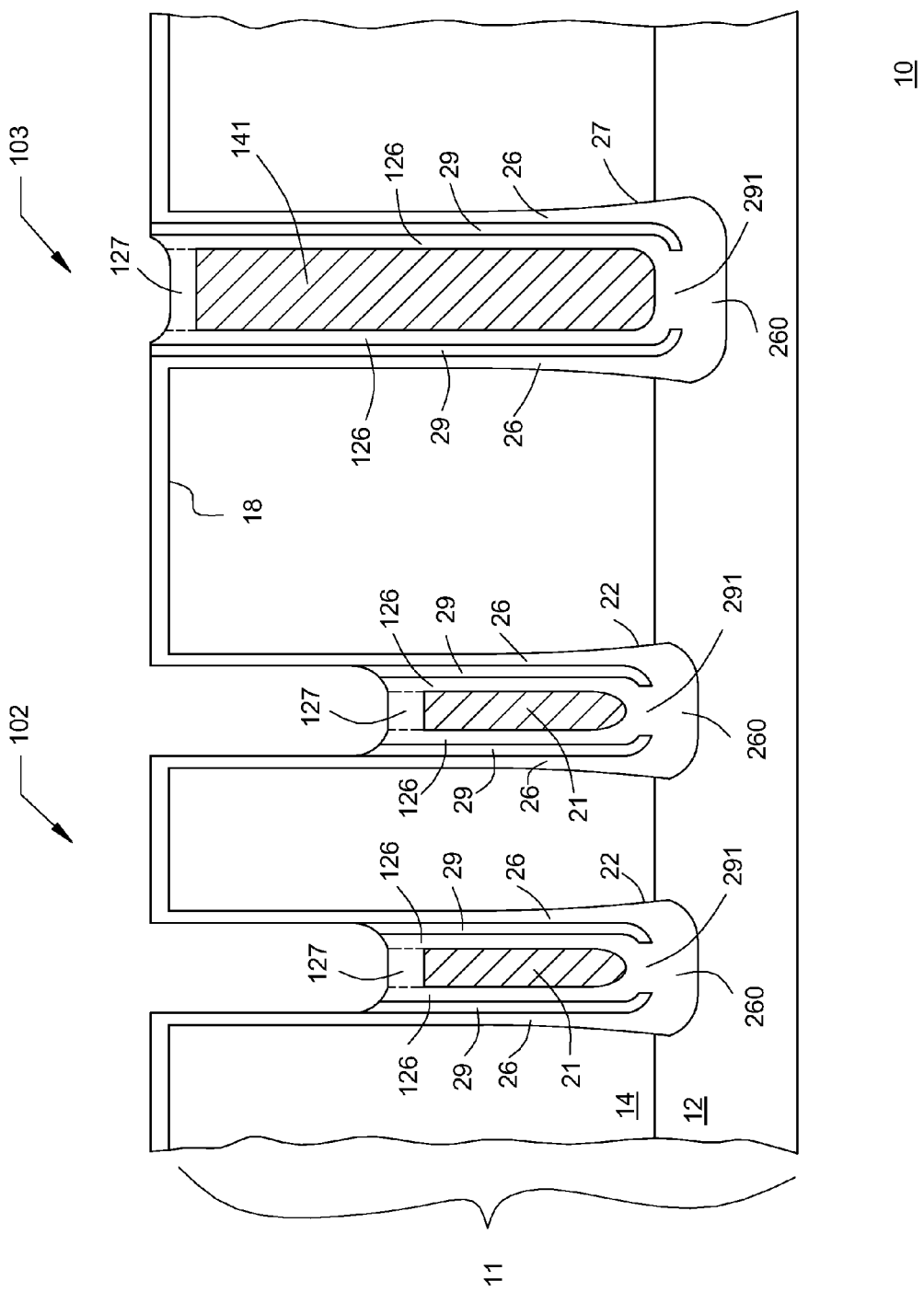

FIGS. 9-11 are partial cross-sectional views of device 10 in a sequence of process steps that can be used as another option to form an interlayer film overlying shield electrodes 10. With reference back to FIG. 6, FIG. 9 shows device 10 after portions of layer 126 are removed from trenches 22 and 27. As shown in FIG. 9, this step can expose portions of shield electrodes 21 and shield contact 141. In another embodiment (not shown), exposed portions of shield electrodes 21 and shield contact 41 can subsequently be thermally oxidized. The thermal oxidation step can be followed by a conformal oxide deposition and thin oxide removal to fill in any gas that may form during the oxidation of exposed portions of shield electrode 21. Referring to FIG. 9, in a next step, portions of shield electrodes 21 and shield contact 141 can be removed to further recess these regions within trenches 22 and 27. In one embodiment, about 0.05 microns to about 0.15 microns of material can be removed. FIG. 11 shows device 10 after additional process steps have occurred. Layers 127 can be formed overlying shield electrodes 21 and shield contact 141 as described in conjunction with FIGS. 7-8. Layers 29 can then be removed from upper portions of trenches 22, and additional material can be added to layers 26 along upper portions of trenches 22, as described in conjunction with FIGS. 7-8.

Figure 12:
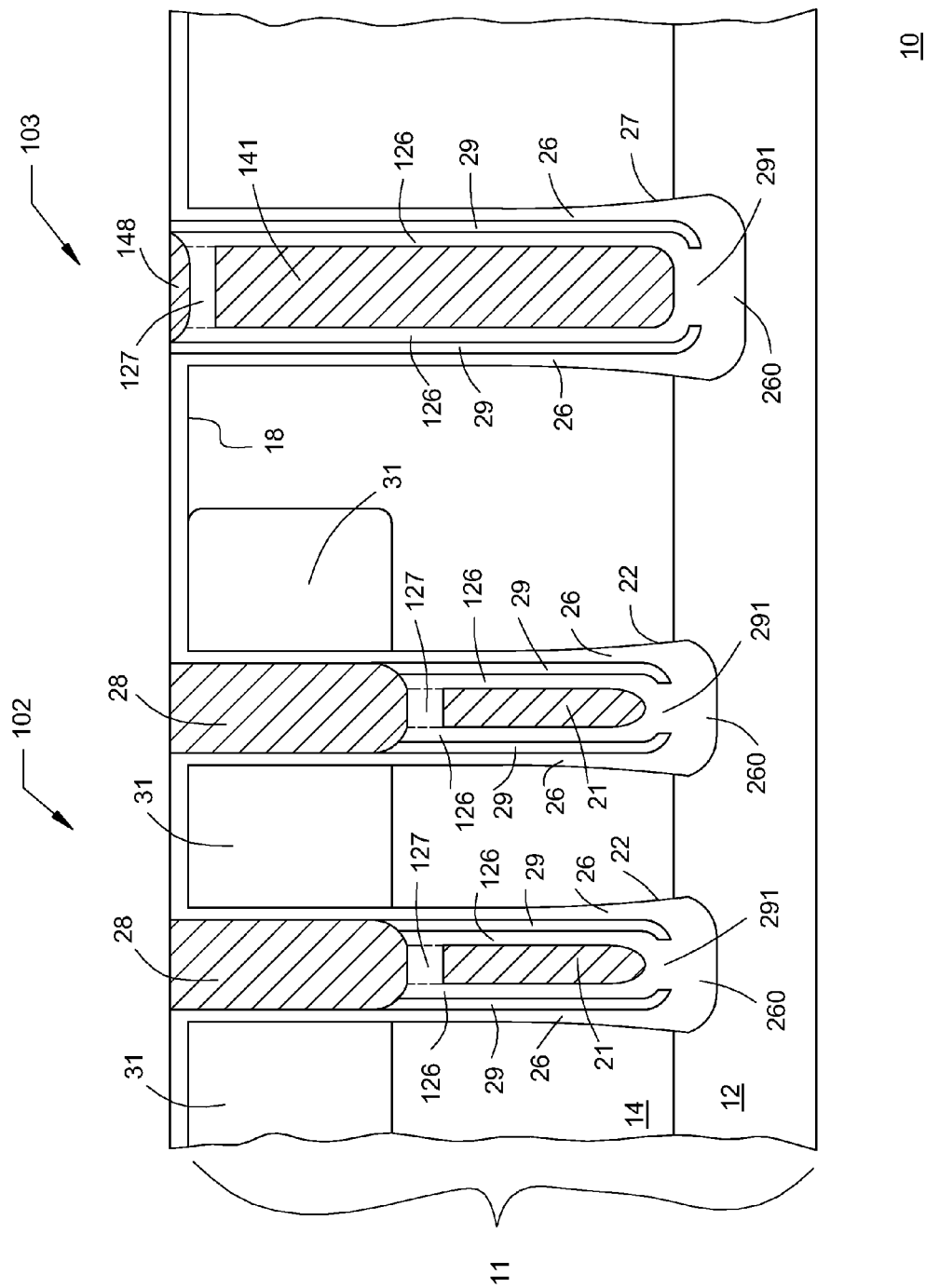

FIG. 12 is a partial cross-sectional view of device 10 after further processing. In one embodiment, a conductive layer or polycrystalline semiconductor layer can be formed overlying major surface 18 and within portions of trenches 22 and 27. In one embodiment, the conductive layer can comprise doped polysilicon. Next, the conductive layer can be planarized. In one embodiment, the conductive layer can be planarized using CMP techniques. The planarized conductive layer forms gate electrodes 28 in trenches 22 and can leave residual material 148 adjacent to trench 27. A masking layer (not shown) can then be formed overlying contact area 103, and a body, base, or doped region or regions 31 can be formed extending from a major surface 18. Body regions 31 can have a conductivity type that is opposite to the conductivity type of semiconductor layer 14. Body regions 31 have a dopant concentration suitable for forming inversion layers that operate as conduction channels or channel regions 45 (shown, for example, in FIG. 15) of transistor 10. Body regions 31 can extend from major surface 18 to a depth, for example, from about 0.5 microns to about 2.0 microns. It is understood that body regions 31 can be formed at an earlier stage of fabrication, for example, before trenches 22 are formed. Body regions 31 can be formed using doping techniques, such as ion implantation and anneal techniques.

Figure 13:
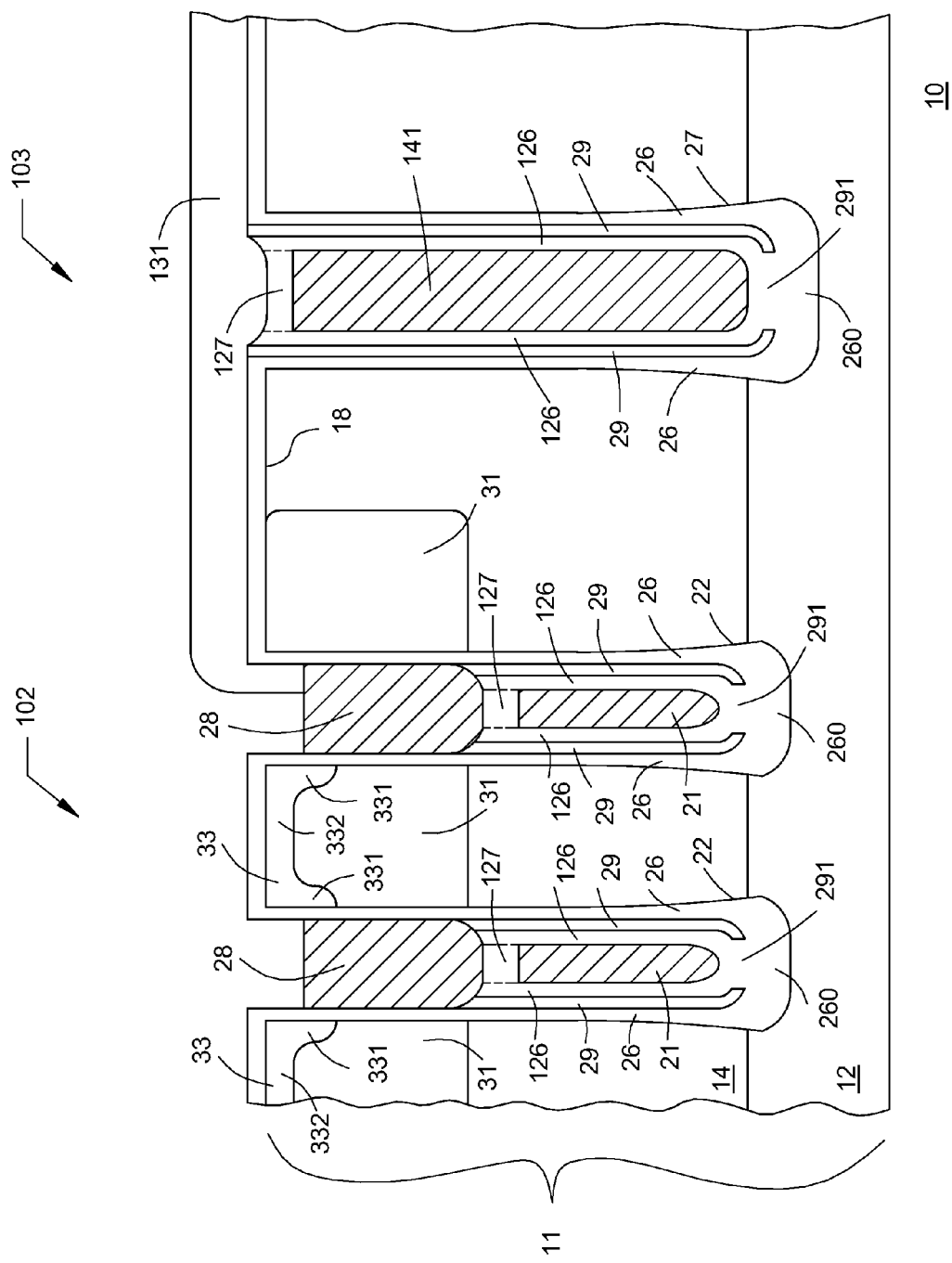

Gate electrodes 28 can be recessed below major surface 18 as shown in FIG. 13. In one embodiment, about 0.15 microns to about 0.25 microns of material can be removed. This step can also remove residual material 148 from trench 27. A masking layer 131 is then formed overlying contact 103. N-type source regions, current conducting regions, or current carrying regions 33 can then be formed within, in, or overlying body regions 31. In one embodiment, an angled ion implant doping process can be used to form source regions 33 within body regions 31. In one embodiment, a high-angle implanter can be used to implant dopant from at least two separate directions at about 40 degrees from the wafer normal. The high-angle implant step forms source regions 33 having extensions 331 in proximity to the sidewalls of trenches 22. Extensions 331 can have a greater depth than central portions 332 of source regions 33 to form a walled-contact source region. Masking layer 131 can then be removed, and the implanted dopant can be annealed. In an optional step, gate electrodes 28 can be recessed further into trenches 22.

Figure 14:
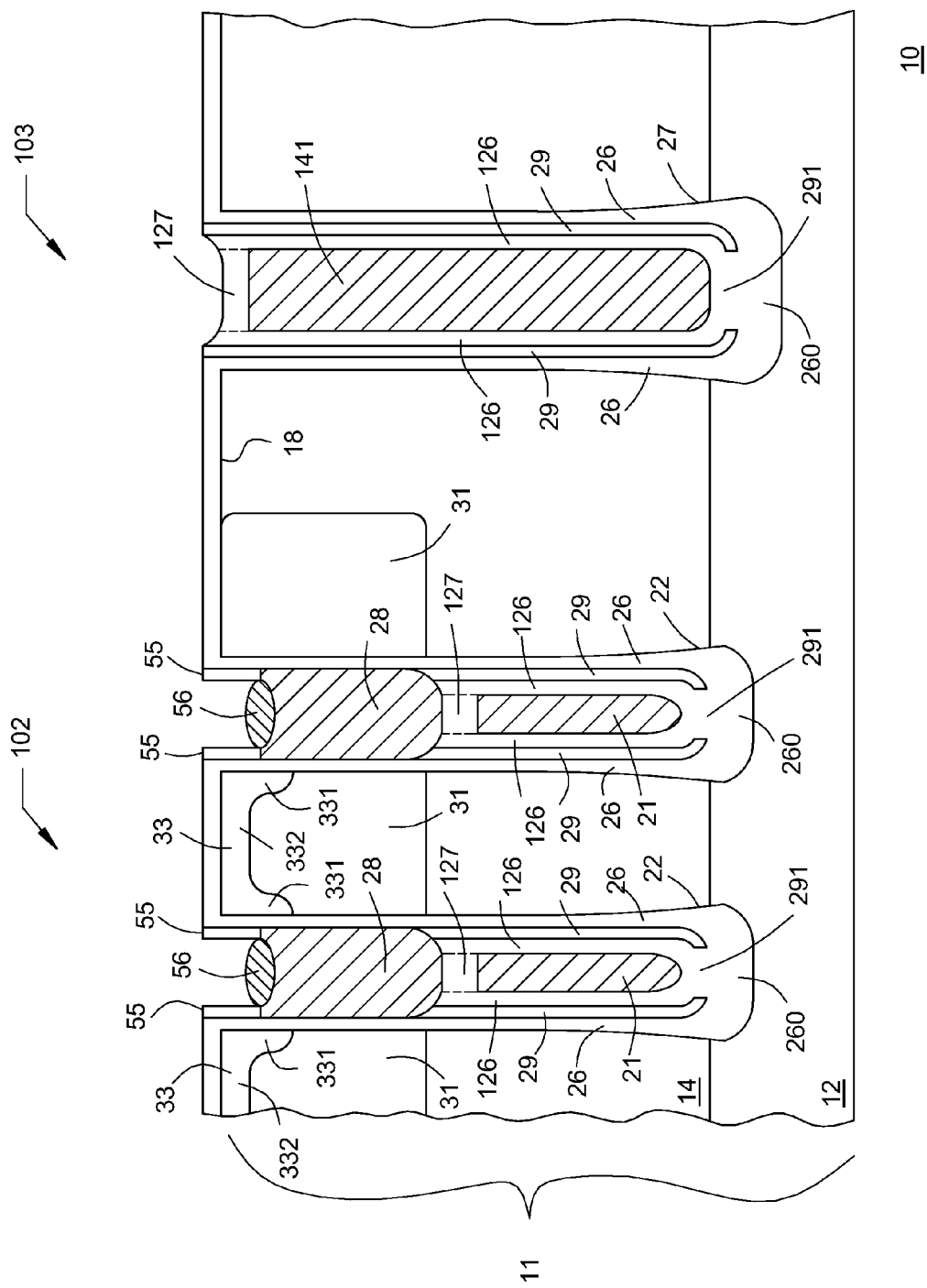

In an optional step, a layer of material is then formed overlying major surface 18, sidewall portions of trenches 22, and upper surfaces of gate electrodes 28. The layer of material can then be removed in part to form spacer layers 55 as shown in FIG. 14. In one embodiment, spacer layers 55 can comprise a dielectric material. In one embodiment, spacer layers 55 can comprise silicon nitride. Conductive regions 56 can be formed in upper surfaces of gate electrodes 28. In one embodiment, conductive regions 56 can comprise a silicide material. In one embodiment, conductive regions 56 can comprise cobalt silicide.

Figure 15:
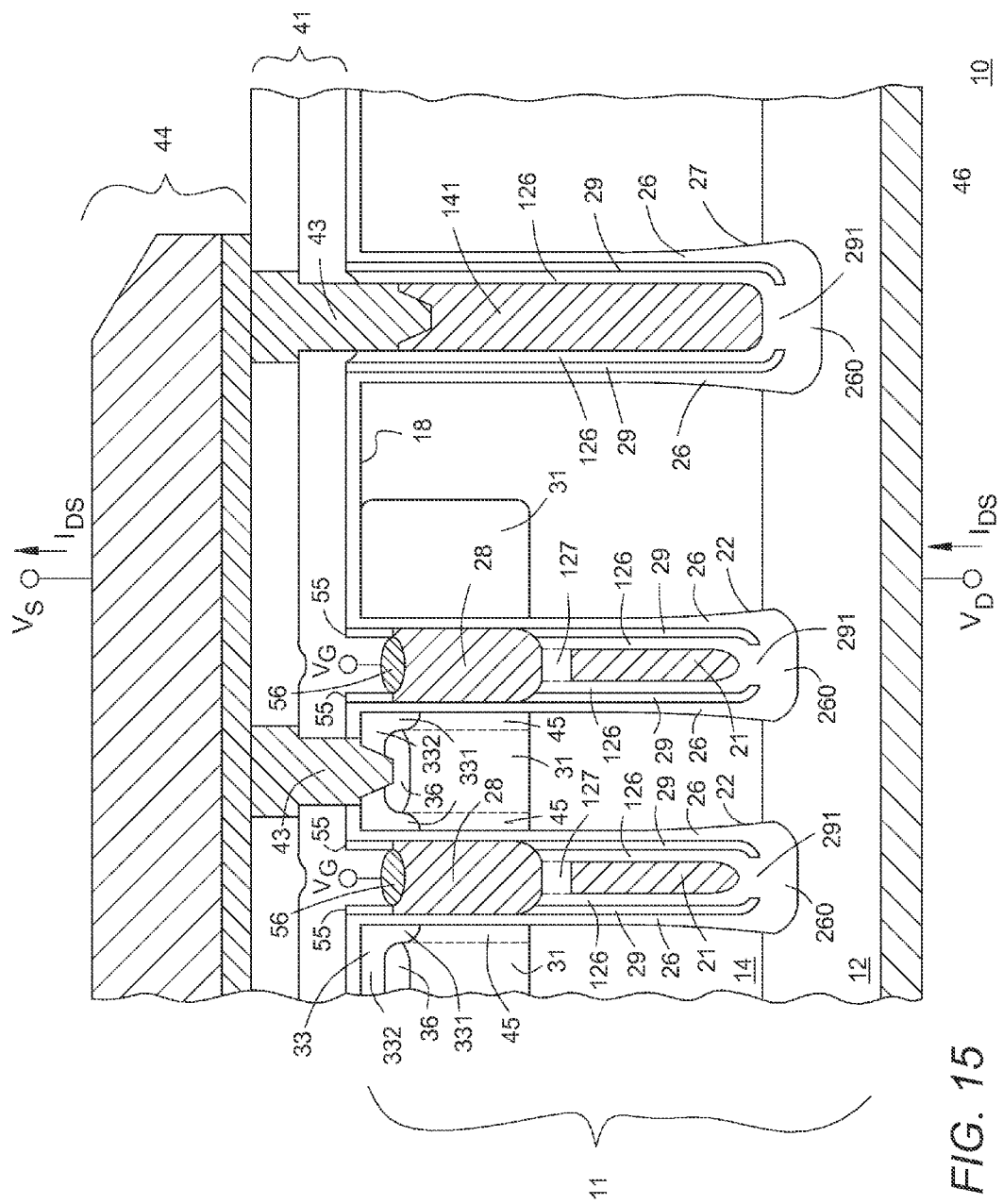
FIG. 15 illustrates a partial cross-sectional view of the semiconductor device of FIGS. 1-14 at a later stage of fabrication.

FIG. 15 shows a partial cross-sectional view of device 10 at a later stage of fabrication. In one embodiment, a layer or layers 41 is/are formed overlying major surface 18. In one embodiment, layers 41 can comprise dielectric layers. In one embodiment, layers 41 can comprise silicon oxides such as doped or undoped deposited oxides. In one embodiment, layers 41 can comprise at least one layer of deposited silicon oxide doped with phosphorous or boron and phosphorous and at least one layer of undoped oxide. In one embodiment, layers 41 can have a thickness from about 0.4 microns to about 1.0 microns. In one embodiment, layers 41 can be planarized to provide a more uniform surface topography, which improves manufacturability.

Next, a masking layer (not shown) is formed overlying device 10, and openings, vias, or contact trenches can formed for making contact to source regions 33, body regions 31, and shield contact 141. In one embodiment, the masking layer can be removed, and a recess etch can be used to remove portions of source regions 33 and portions of shield contact 141. The recess etch step can expose portions of body regions 31 below source regions 33. A p-type body contact, enhancement region, or contact region 36 can then be formed in body regions 31, which typically is configured to provide a lower contact resistance to body regions 31. One advantage of extensions 331 of source regions 33 is that because they can be deeper than portions 332 are, extensions 331 can compensate for any mis-alignment issues when forming the contact openings and contact regions 36.

Conductive regions or plugs 43 can then be formed through the openings in layers 41 to provide for electrical contact to source regions 33 and body regions 31 through contact regions 36. In one embodiment prior to forming conductive plugs 43, a wet dielectric contact widening etch can be used, which opens up the contacts in certain regions. For example, as shown in FIG. 15, a contact widening process step can provide a stepped-like contact depending on what materials are selected for layers 41. By way of example, less dense oxides, which can etch faster than more dense oxides, can be used for upper layers of layers 41.

In one embodiment, conductive regions 43 are conductive plugs or plug structures. In one embodiment, conductive regions 43 can comprise a conductive barrier structure or liner plus a conductive fill material. In one embodiment, the barrier structure can include a metal/metal-nitride configuration, such as titanium/titanium-nitride or the like. In another embodiment, the barrier structure can further include a metal-silicide structure. In one embodiment, the conductive fill material includes tungsten. In one embodiment, conductive regions 43 can be planarized to provide a more uniform surface topography.

A conductive layer 44 can be formed overlying major surface 18, and a conductive layer 46 can be formed overlying a surface of semiconductor material 11 opposite major surface 18. Conductive layers 44 and 46 typically are configured to provide electrical connection between the individual device components of device 10 and a next level of assembly. In one embodiment, conductive layer 44 is titanium/titanium-nitride/aluminum-copper or the like and is configured as a source electrode or terminal. In one embodiment, conductive layer 46 is a solderable metal structure such as titanium-nickel-silver, chromium-nickel-gold, or the like and is configured as a drain electrode or terminal. In one embodiment, a further passivation layer (not shown) can be formed overlying conductive layer 44. In one embodiment, all or a portion of shield electrodes 21 are connected (in another plane) to conductive layer 44, so that shield electrodes 21 are configured to be at the same potential as source regions 33 when device 10 is in use. In another embodiment, shield electrodes 21 can be configured to be independently biased or coupled in part to gate electrode 28. One advantage of the process flow described with FIGS. 1-15 is that layer 26 or the gate layer is formed before layer 29 is formed instead of being formed later in the process flow after layer 29 is formed. By forming layer 26 first, among other things, the integrity of the interface between layer 26 and semiconductor layer 14 is improved, which enhances the reliability of device 10.

In one embodiment, the operation of device 10 proceeds as follows. Assume that source electrode (or input terminal) 44 and shield electrodes 21 are operating at a potential $V_S$ of zero volts, gate electrodes 28 would receive a control voltage $V_G$ of 4.5 volts, which is greater than the conduction threshold of device 10, and drain electrode (or output terminal) 46 would operate at a drain potential $V_D$ of less than 2.0 volts. The values of $V_G$ and $V_S$ would cause body region 31 to invert adjacent gate electrodes 28 to form channels 45, which would electrically connect source regions 33 to semiconductor layer 14. A device current $I_{DS}$ would flow from drain electrode 46 and would be routed through semiconductor layer 14, channels 45, and source regions 33 to source electrode 44. In one embodiment, $I_{DS}$ is on the order of 10.0 amperes. To switch device 10 to the off state, a control voltage $V_G$ that is less than the conduction threshold of device 10 would be applied to gate electrodes 28 (e.g., $V_G$<1.0 volts). Such a control voltage would remove channels 45 and $I_{DS}$ would no longer flow through device 10. In accordance with the present embodiment, regions 260 are configured to decrease output capacitance ($C_{oss}$) of device 10, which reduces switching losses.

Figure 16:
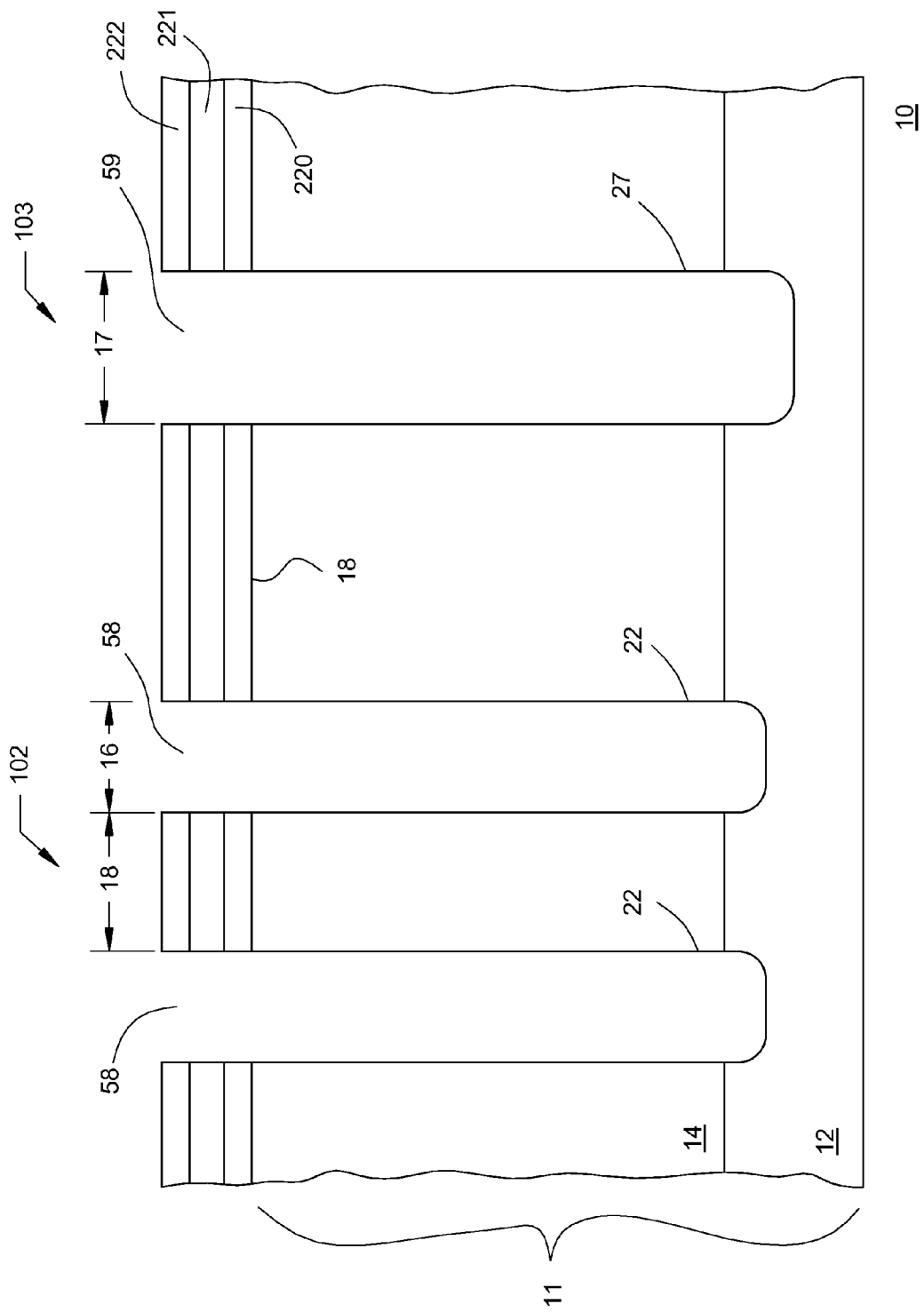
FIGS. 16-19 illustrate partial cross-sectional views of an alternative embodiment of fabricating the semiconductor device of FIG. 15 in accordance with the present invention.

Turning now to FIGS. 16-19, an alternative embodiment for forming regions 260 in device 10 is described. FIG. 16 shows a partial cross-sectional view of region of semiconductor material 11 at an early stage of fabrication. A hard mask structure can be formed overlying major surface 18. In one embodiment, the hard mask structure can comprise a layer 220 of silicon oxide, a layer 221 of silicon nitride, and a layer 222 of silicon oxide. Next, openings 58 and 59 can be formed within the hard mask structure. In one embodiment, a photo-resist masking process can be used to form openings 58 and 59. In one embodiment, openings 58 can have an initial width 16 of about 0.2 microns to about 0.22 microns, and openings 59 can have an initial width 17 of about 0.4 microns to about 0.5 microns. In one embodiment, an initial spacing 18 between openings 58 can be about 0.55 microns to about 0.65 microns.

After openings 58 and 59 are formed, segments of semiconductor layer 14 can be etched to form trenches 22 and 27 extending from major surface 18. By way of example, trenches 22 and 27 can be formed using plasma etching techniques with a fluorocarbon chemistry (e.g., $SF_6/O_2$). In one embodiment, trenches 22 and 27 can extend through semiconductor layer 14 and into substrate 12.

Figure 17:
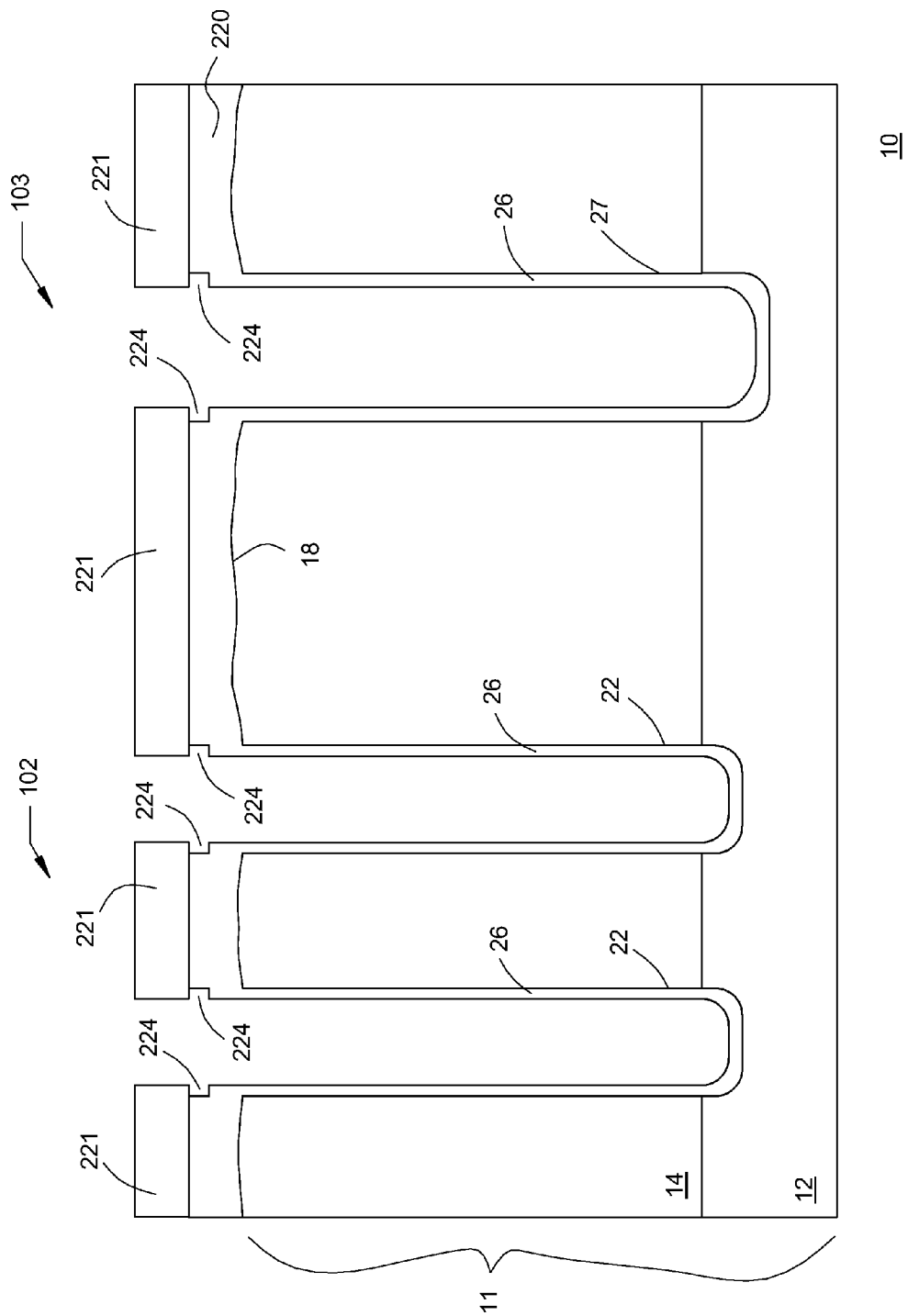

FIG. 17 shows a partial cross-sectional view of device 10 after additional processing. In an optional step, a sacrificial layer (not shown) is formed overlying surfaces of trenches 22 and 27. By way of example, a thermal silicon oxide layer can be grown. Next, the sacrificial layer and layer 222 can be removed. In one embodiment, a wet oxide etch can be used for this step. This step can form undercut portions 224 in layer 220. That is, portions of layer 221 overhang portions of layer 220 in proximity to trenches 22 and 27. In accordance with the present embodiment, a layer of material can then be formed overlying surfaces of trenches 22 and 27, which forms gate layers 26 in trenches 22. By way of example, gate layers 26 typically comprise oxides, nitrides, tantalum pentoxide, titanium dioxide, barium strontium titanate, combinations thereof, or the like. In one embodiment, gate layers 26 comprise silicon oxide and can have a thickness from about 0.01 microns to about 0.05 microns.

Figure 18:
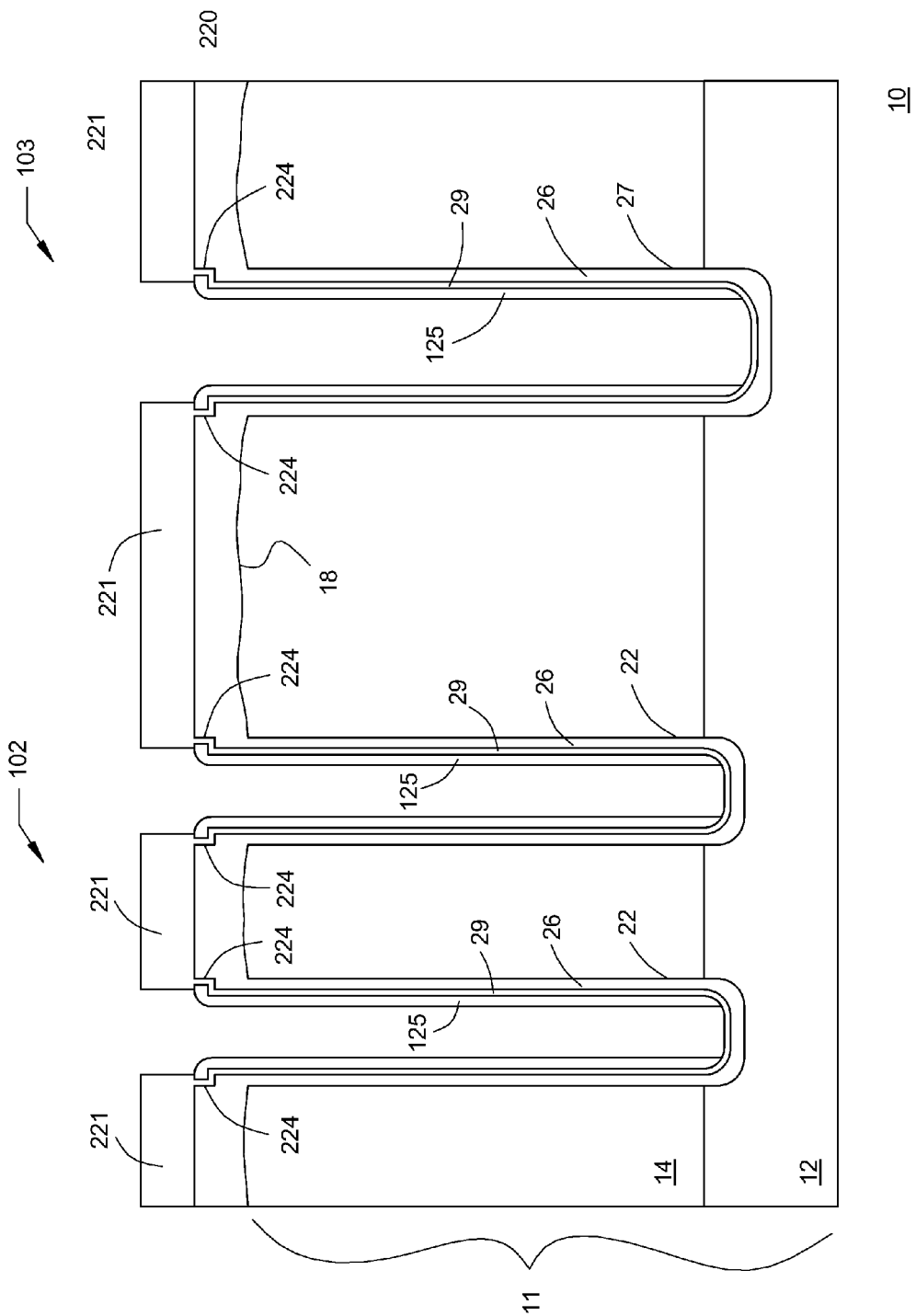

Next, layers 29 can be formed adjacent to gate layers 26 in trenches 22 and 27 as shown in FIG. 18. Layers 29 can comprise a material that is different than that of gate layers 26, and in one embodiment layers 29 can comprise silicon nitride when gate layers 26 comprise silicon oxide. In view of the tight dimensions of widths 16 of trenches 22, layers 29 can be formed overlying gate layers 26 without an intervening polysilicon layer. In one embodiment, layers 29 can have a thickness of about 0.01 microns to about 0.02 microns. In one embodiment, a short HF etch can be used to prior to forming layers 29. Next, a layer of material is formed overlying layers 29 and layer 221 and then is partially removed to form spacer layers 125. In one embodiment, spacer layers 125 can comprise undoped polysilicon. In one embodiment, spacer layers 125 can have a thickness from about 0.01 microns to about 0.02 microns. Spacer layers 125 can provide protection for layers 29 in subsequent processing, particularly when layers 29 are thin. These steps reduce width 16 by about 0.03 microns, and the width of trenches 22 is reduced by about 0.05 microns. One or both of layers 29 and spacer layers 125 can fill or partially fill undercut portions 224.

Figure 19:
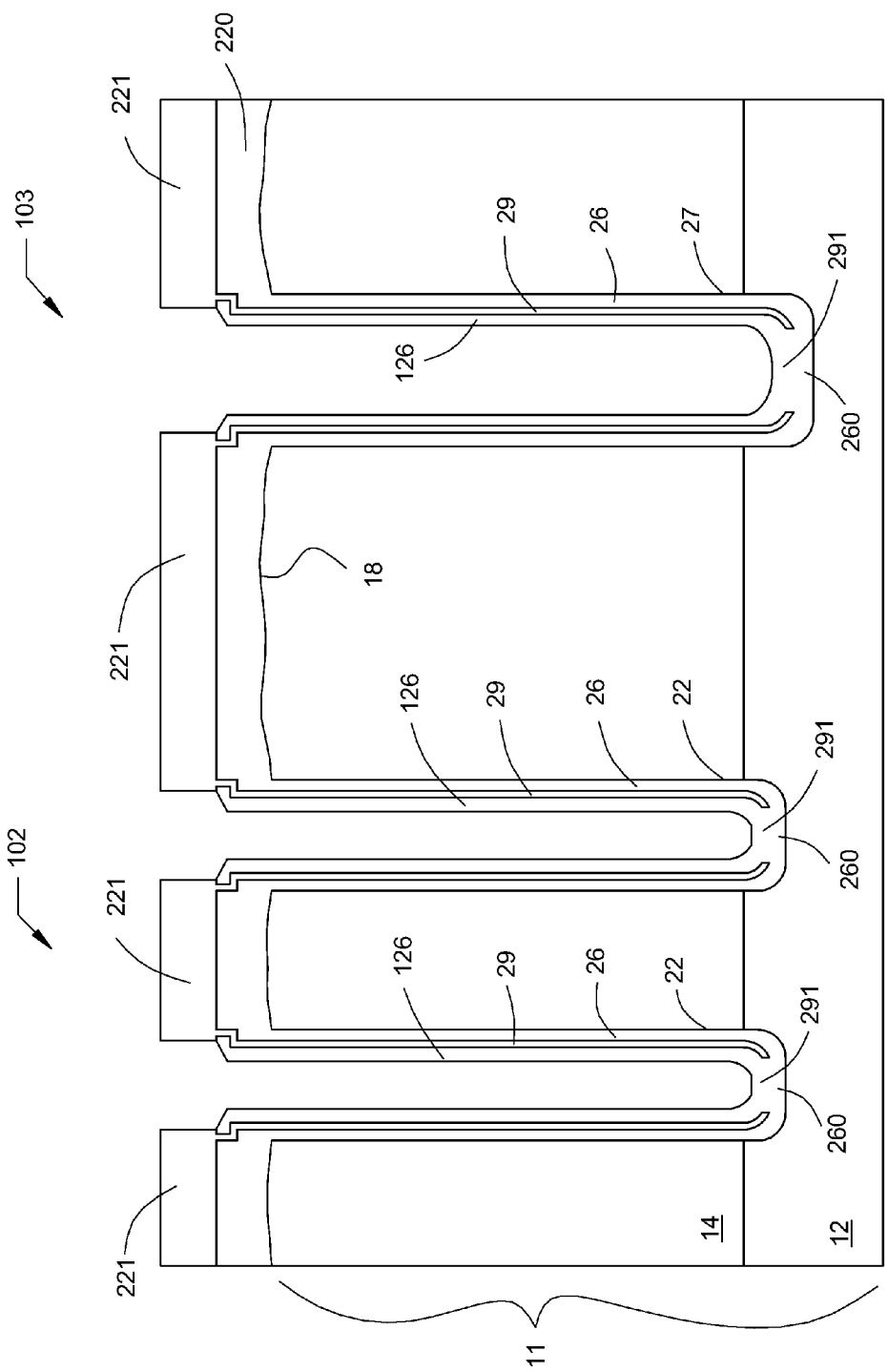

FIG. 19 shows a partial cross-section view of device 10 after further processing. In one embodiment, portions of layer 29 are removed from lower regions of trenches 22 and 27, and spacer layers 125 can be used as protective layers for those portions of layers 29 along sidewall portions of trenches 22 and 27. In one embodiment, a reactive ion etch (RIE) process can be used to remove portions of layers 129. By way of example, an $SF_6/O_2$-argon chemistry can be used for this step.

Next, regions 260 of material can be formed along lower portions or segments of trenches 22 and 27. In one embodiment, regions 260 can comprise dielectric materials. For example, regions 260 can comprise silicon oxide regions formed using wet oxide growth techniques or localized oxidation techniques. In one embodiment, regions 260 preferably are thicker than layers 26 are. By way of example, regions 260 have a thickness of about 0.1 microns to about 0.2 microns. In this embodiment, during the formation of regions 260, spacer layers 125 can be converted to silicon oxide in a self-limiting way (for example, the self-limitation is a function of the thickness of spacer layers 125 when such layers comprise polysilicon). This conversion step can be used to form layers 126. In this embodiment, layers 29 in device 10 are discontinuous at lower portions of trenches 22 and 27. Moreover, gaps 291 are formed between adjacent portions of layers 29 adjacent to lower portions of trenches 22 and 27.

The process described in FIGS. 16-19 has several advantages. First, this process flow provides staggered or widened openings above trenches 22, which can provide for more efficient filling of trenches 22 in subsequent process steps. Second, this flow allows for thinner layers 29, which, when layers 29 comprise silicon nitride, can reduce charge trapping issues that can be associated with silicon nitride films. Among other things, such trapped charge can degrade threshold voltage (Vt) for device 10 and can also degrade on-resistance. Device 10 can be further processed, in general, in accordance with the steps described in conjunction with FIGS. 5-15.

Figure 20:
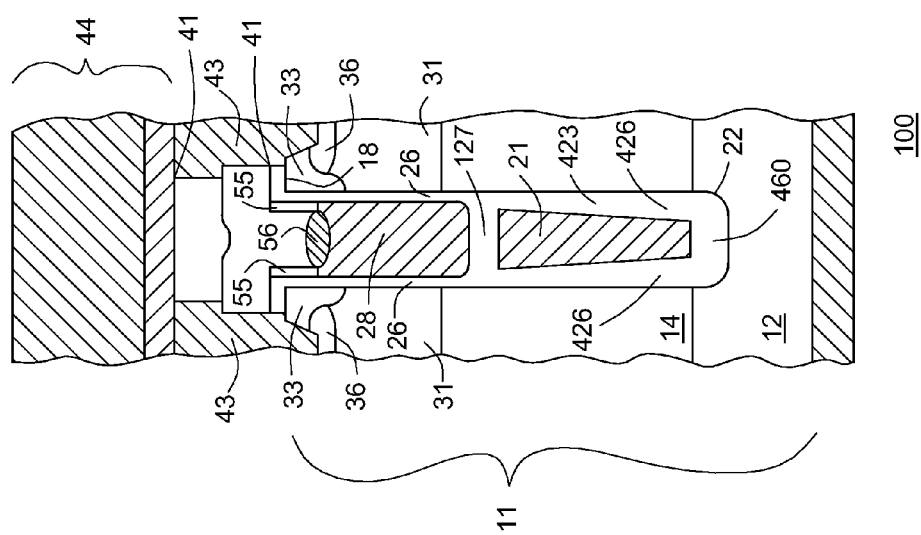
FIG. 20 illustrates a partial cross-sectional view of another embodiment of a semiconductor device in accordance with the present invention.

FIG. 20 shows a partial cross-sectional view of a device 100 in accordance with another embodiment. Device 100 is similar to device 10, and similar features are numbered similarly. Device 100 can be configured as a vertical power MOSFET having an insulated shield electrode 21 located below or underlying a trench gate structure, which can comprise layers 26 and gate electrode 28. That is, device 100 can have a substantially vertically stacked configuration for the gate and shield structures. In accordance with this embodiment, device 100 can further comprise a shield isolation layer 423, which can include portions or layers 426 that have variable thickness along sidewalls of trench 22 (and trench 27 (not shown)). In one embodiment, portions 426 gain thickness as portions 426 approach the lower surface of trench 22. Furthermore, portions 426 can be sloped, stepped in shape, or contoured on at least one side. The at least one side can be adjacent shield electrode 21, can be adjacent semiconductor layer 14, or can be a combination of both. Shield isolation layer 423 can further include a portion 460 formed along lower surface of trench 22 as shown in FIG. 20. In one embodiment, portion 460 can be similar to region 260 and can have a thickness greater than that of layers 26. Device 100 can be configured in a high density vertical MOSFET structure for higher $BV_{DSS}$ and reduced capacitance (for example, $C_{oss}$) performance.

Figure 21:
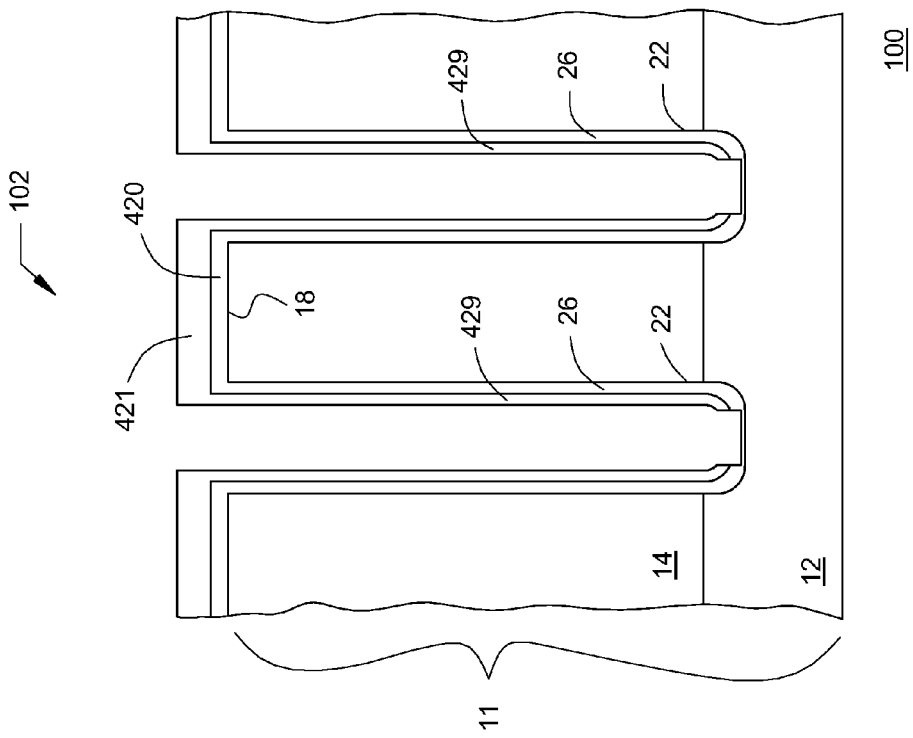
FIGS. 21-23 illustrate partial cross-sectional views of the semiconductor device of FIG. 20 at various stages of fabrication in accordance with another embodiment of the present invention.
Figures 22, 23:
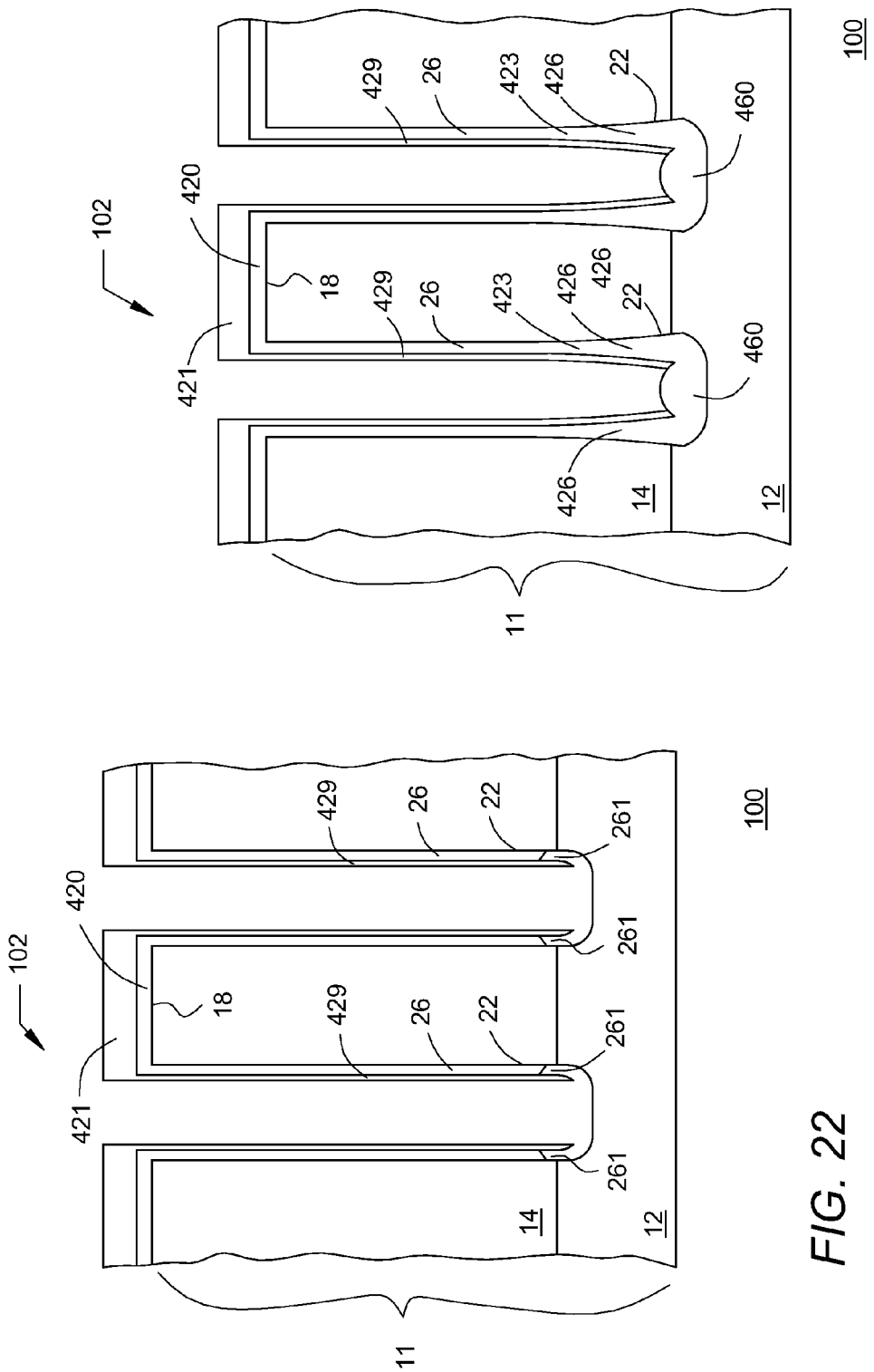

FIGS. 21-23 are partial cross-sectional views of device 100 at early stages of fabrication in accordance with a first embodiment after trenches 22 have been formed. In this embodiment, layer 420 can be formed overlying major surface 18, and layer 421 can be formed overlying layer 420. In one embodiment, layer 420 can comprise a silicon oxide, and layer 421 can comprise a silicon nitride. In one embodiment, layers 26 can be formed adjacent to surfaces of trenches 22, and spacer layers 429 can be formed adjacent portions of layers 26 (as shown in FIG. 21) leaving portions of layers 26 exposed along lower portions of trenches 22. In one embodiment, layers 429 can comprise silicon nitride and can have a thickness from about 0.0075 microns to about 0.015 microns. Next, portions of layers 26 can be removed from lower portions of trenches 22 as shown in FIG. 22. In one embodiment, a wet etch can be used to remove portions of layer 26 while using layers 421 and 429 as masking layers. In one embodiment, portions of layer 26 are undercut with respect to layers 429 to form undercut portions 261, and the amount of undercutting can be adjusted in accordance with thickness requirements for portions 426 of layer 423.

FIG. 23 shows a partial cross-sectional view of device 100 after additional processing. In one embodiment, a wet oxidation process or a localized oxidation process can be used to form layer 423 having portions 426 along lower sidewalls surfaces of trenches 22, and portions 460 along lower surfaces of trenches 22. In one embodiment, portions 460 can have a thickness from about 0.1 microns to about 0.2 microns. In one embodiment, portions 426 vary in thickness from that of layers 26 to about the thickness of portions 460 along the sidewall portions adjacent to shield electrode 21. Device 100 can be completed using the process steps discussed in conjunction with FIGS. 5-15. In one embodiment, layers 429 can be left in place when forming shield electrodes 21. In one embodiment, layers 429 can be removed before forming shield electrodes 21, which is the configuration shown in FIG. 20.

FIGS. 24-27 are partial cross-sectional views of device 100 at early stages of fabrication in accordance with a second embodiment after trenches 22 have been formed to an initial depth. Similar to FIG. 21, a layer 420 can be formed overlying major surface 18, and a layer 421 can be formed overlying layer 420. In one embodiment, layer 420 can comprise a silicon oxide, and layer 421 can comprise a silicon nitride. In one embodiment, layers 26 can be formed overlying surfaces of trenches 22, and spacer layers 529 can be formed overlying portions of layers 26. In one embodiment, spacer layers 529 can comprise silicon nitride and can have thickness on the order of about 0.01 microns. Using spacer layers 529 as a mask, portions of layers 26 can be removed to expose portions of semiconductor layer 14 in lower portions of trenches 22.

Figure 25:
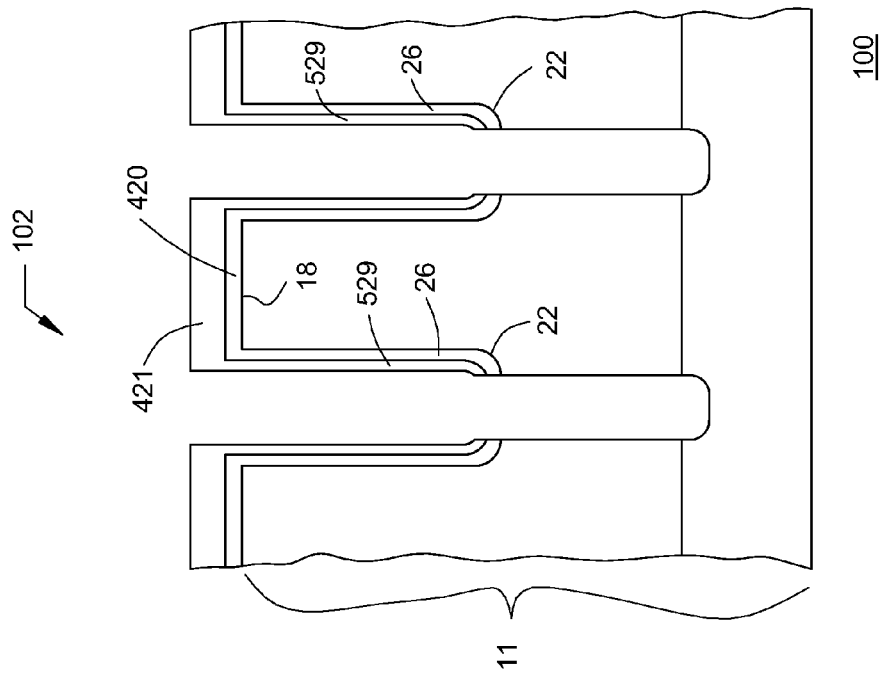
Figure 24:
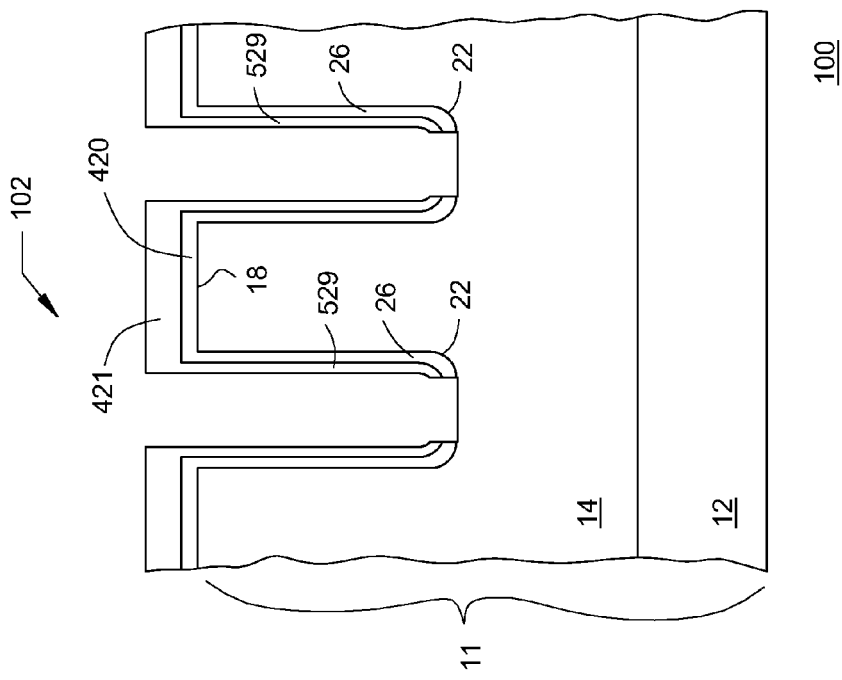

FIG. 25 is a partial cross-sectional view of device 100 after trenches 22 are formed deeper into semiconductor layer 14 to a second depth. Trenches 22 can be etched deeper or further using plasma etching techniques with a fluorocarbon chemistry (e.g., $SF_6/O_2$). Next, a sacrificial layer (not shown), such as a thermal oxide layer can be formed adjoining exposed surfaces of trenches 22, which can then be removed. Layers 526 can then be formed overlying surfaces of trenches 22 as shown in FIG. 26. In one embodiment, layers 526 can comprise a silicon oxide. Next, layers 429 can be formed adjacent to layers 526. In one embodiment, layers 429 can comprise a silicon nitride layer and can be less than about 0.01 microns in thickness. Portions of layers 429 can then be removed from lower portions of trenches 22 to expose portions of layers 526. In one embodiment, portions of layers 526 can be removed using remaining portions of layers 429 as a mask. In another embodiment, portions of layers 429 are not removed.

FIG. 27 is a partial cross-sectional view of device 100 after further processing. In one embodiment, shield isolation layers 423 are formed along lower portions of trenches 22 as shown in FIG. 27. In one embodiment, a wet oxidation process can be used to form shield isolation layers 423, which includes portions 426 that have variable thickness along sidewalls of trenches 22 and that further includes portions 460. In one embodiment, portions 460 can have a thickness greater than layers 26. Device 100 can be completed using the process steps discussed in conjunction with FIGS. 5-15. In one embodiment, layers 429 or portions of layers 429 can be left in place when forming shield electrodes 21. In one embodiment, layers 429 can be removed before forming shield electrodes 21, which is the configuration shown in FIG. 20. In one embodiment, layers 529 can be removed before forming gate electrodes 28.

Figure 28:
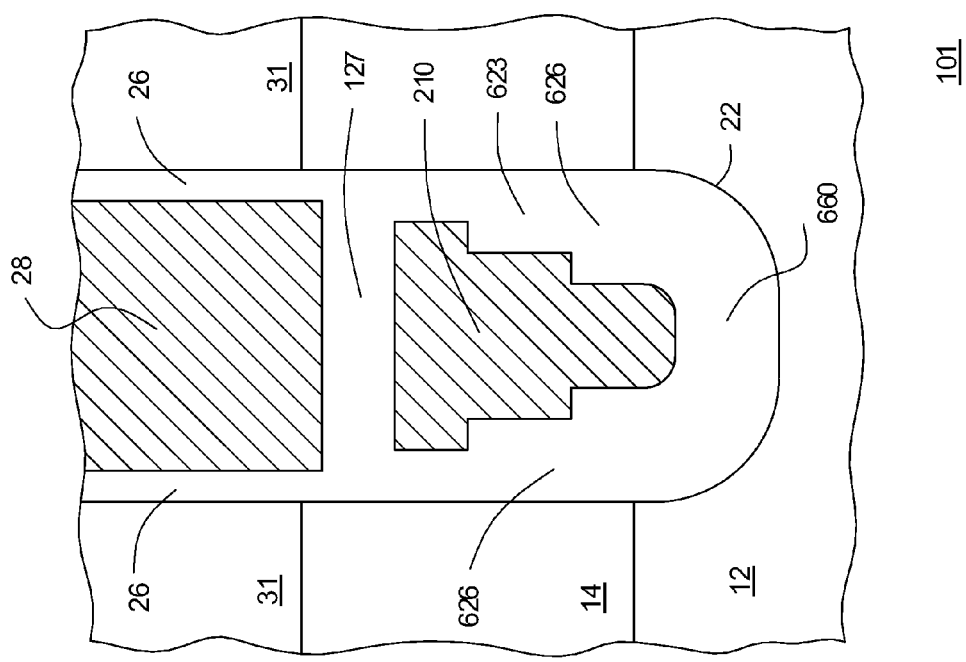
FIG. 28 illustrates a partial cross-sectional view of further embodiment of a semiconductor device in accordance with the present invention.

FIG. 28 shows a partial cross-sectional view of a device 101 in accordance with a further embodiment. Device 101 is similar to device 100, except that the insulated shield structure includes a stepped shield electrode or shield electrode with a stepped shape 210 and shield insulation structure or layer 623. Insulation structure 623 can include stepped side portions 626 that preferably enlarge or gain in thickness in proximity to the lower surface of trench 22 and to region or portion 660, which is similar to region 260 and portion 460 described previously. Insulation structure 623 is configured to improve $BV_{DSS}$ and switching performance. Stepped shield electrode 210 and insulation structure 623 can be formed starting from, for example, the intermediate structure shown in FIG. 23. In a subsequent step, layers 429 can be removed, and additional material, such as an oxide, can be added adjacent to layers 26. In another embodiment, layers 26 can be made to be thicker in an earlier step. Then, the steps of 1) depositing polysilicon within trench 22, 2) optionally planarizing the polysilicon, 3) recessing the polysilicon, and 4) removing or thinning portions of layers 26 are conducted and repeated one or more times to provide the stepped structure shown in FIG. 28.

From all of the foregoing, one skilled in the art can determine that according to one embodiment, a method for forming a semiconductor device comprises the steps of providing a region of semiconductor material (for example, element 11) having a major surface and forming a trench (for example, element 22) extending from the major surface. The method includes forming a first layer (for example, element 26) overlying surfaces of the trench and forming a spacer layer (for example, elements 29, 429) adjacent to the first layer, where the spacer layer comprises a material different than the first layer. The method includes forming a first region (for example, element 260, 460, 660) comprising a material different than that of the spacer layer in proximity to a lower surface of the trench, and forming a first electrode (for example, elements 21, 210) in a lower portion of the trench that is adjacent to portions of the spacer layer and the first region, where portions of the first layer are between the first electrode and the region of semiconductor material. The method includes forming a dielectric layer (for example, element 127) above the first electrode, and forming a second electrode (for example, element 28) adjacent to the first layer and to the dielectric layer, where at least a portion of the second electrode is within the trench.

Those skilled in the art will also appreciate that according to another embodiment, a method for forming a semiconductor device that comprises the steps of providing a region of semiconductor material having a major surface, and forming a trench (for example, element 22) extending from the major surface, where the trench has sidewall surfaces and a lower surface. The method includes forming a first dielectric layer (for example, element 26) adjoining the sidewall surfaces and the lower surfaces and forming first spacer layers (for example, elements 29, 429) adjacent to the gate dielectric layer while leaving a segment of the gate dielectric layer exposed in proximity to the lower surface. The method includes removing portions of the first dielectric layer from the lower surface adjacent to the first spacer layers and the region of semiconductor material and forming a first dielectric region (for example, elements 260, 460, 560) adjoining the lower surface, where the first dielectric layer is thicker than the gate dielectric layer. The method includes forming a second dielectric layer (for example, element 126) adjacent to the spacer layers, and forming a first conductive region (for example, elements 21, 210) adjacent the first dielectric region and to the second dielectric layer, forming a second dielectric region (for example, element 127) adjacent to an upper surface of the first electrode. The method includes removing portions of the second dielectric layer and spacer layers adjacent to upper portions of the trench, and forming a second conductive region (for example, element 28) adjacent to the first dielectric layer and to the second dielectric region.

Those skilled in the art will also appreciate that according to yet another embodiment, a semiconductor device structure that comprises a region of semiconductor material having a trench extending from a major surface, where the trench (for example, element 22) has sidewall surfaces and a lower surface. The structure includes an insulated shield electrode formed within the trench, where the insulated shield electrode includes an insulating layer (for example, elements 26, 29, 126, 260, 423, 426, 429, 460, 623, 626, 660), a shield electrode (for example, element 21, 210) adjacent to the insulating layer, and a first dielectric region (for example, element 127) adjacent to an upper surface of the shield electrode, where the insulating layer has a variable thickness along lower portions of the sidewall surfaces with a thicker portion in proximity to the lower surface. The structure includes an insulated gate electrode formed within the trench above the insulated shield electrode, where the insulated gate electrode includes a gate dielectric layer (for example, element 26) adjacent to upper surfaces if the trench and a gate electrode (for example, element 28) adjacent the gate dielectric layer and the first dielectric region. The structure includes a body region (for example, element 31) adjacent to the trench, and a source region (for example, element 33) adjacent to the trench.

In view of all the above, it is evident that a novel method and device is disclosed. Included, among other features, is forming a shield insulating layer or layers having a variable thickness where the shield insulating layers combine to be thicker at lower portions of trenches where the shield electrodes can be formed. The shield insulating layers provide improved output capacitance performance and improved $BV_{DSS}$ performance.

Although the subject matter of the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications that fall within the scope of the appended claims.

We claim:

1. A method for forming a semiconductor device comprising the steps of:
providing a region of semiconductor material having a major surface;
forming a trench extending from the major surface;
forming a first layer overlying surfaces of the trench;
forming a spacer layer adjacent the first layer, where the spacer layer comprises a material different than the first layer, where the spacer layer is discontinuous in proximity to a lower surface of the trench;
forming a first region comprising a material different than the spacer layer in proximity to the lower surface of the trench;
forming a first electrode in a lower portion of the trench and adjacent portions of the spacer layer and the first region, where portions of the first layer are between the first electrode and the region of semiconductor material;
forming a dielectric layer above the first electrode; and forming a second electrode adjacent the first layer and the dielectric layer, where at least a portion of the second electrode is within the trench.

2. The method of claim 1 further comprising the steps of: forming a body region adjoining the trench; and
forming a source region adjoining the body region and the trench, where the step of forming the first layer comprises forming a gate dielectric layer, and where the step of forming the first electrode includes forming a shield electrode, and where the step of forming the second electrode includes forming a gate electrode.

3. The method of claim 1, where the step of forming the spacer layer includes the steps of:
forming a third layer adjacent the first layer; and
removing a portion of the third layer in proximity to the lower surface of the trench.

4. The method of claim 3 further comprising the steps of forming a non-conformal layer overlying the major surface and adjacent the third layer before the step of removing a portion of the third layer, and where the non-conformal layer is thicker in proximity to upper surfaces of the trench.

5. The method of claim 1 further comprising the step of removing portions of the first layer underlying the spacer layer before the step of forming the first region.

6. The method of claim 1, where the step of forming the first layer includes forming a first layer comprising silicon oxide, and where the step of forming the first region includes forming the first region comprising silicon oxide.

7. The method of claim 6, where the step of forming the spacer layer comprises forming the spacer layer comprising silicon nitride.

8. The method of claim 1 further comprising the step of forming a polycrystalline semiconductor spacer layer adjacent the spacer layer before the step of forming the first region.

9. The method of claim 1 further comprising the steps of:
forming a body region adjoining the trench; and
forming a source region adjoining the body region and the trench, where the source region comprises an extension portion adjoining the trench and a central portion adjoining the extension portion, and where the central portion is shallower than the extension portion.

10. The method of claim 1, where the step of forming the first region includes forming the first region having a thickness that increases along lower sidewall surfaces of the first electrode, and, where the thickness is greatest in proximity to a lowest portion of the trench.

11. The method of claim 1, where the step of forming the first electrode includes forming the first electrode having a stepped shape such that the first electrode decreases in width and is narrower in proximity to the lower surface of the trench.

12. A method for forming a semiconductor device comprising the steps of:
providing a region of semiconductor material having a major surface;
forming a trench extending from the major surface, where the trench has sidewall surfaces and a lower surface;
forming a gate dielectric layer adjoining the sidewall surfaces and the lower surfaces;
forming first spacer layers adjacent the gate dielectric layer, where forming the first spacer layers exposes a segment of the gate dielectric layer in proximity to the lower surface;
removing portions of the first dielectric layer from the lower surface adjacent the first spacer layers and the region of semiconductor material;
forming a first dielectric region adjoining the lower surface, where the first dielectric layer is thicker than the gate dielectric layer;
forming a second dielectric layer adjacent the spacer layers;
forming a first conductive region adjacent the first dielectric region and the second dielectric layer;
forming a second dielectric region adjacent an upper surface of the first conductive region;
removing portions of the second dielectric layer and first spacer layers adjacent upper portions of the trench; and
forming a second conductive region adjacent the first dielectric layer and the second dielectric region.

13. The method of claim 12, where the step of forming the first spacer layers comprises the steps of:
forming a layer of material adjacent the first dielectric layer;
forming a non-conformal layer of material adjacent the layer of material, where the non-conformal layer is thicker in proximity to upper portions of the trench; and
removing portions of the non-conformal layer and the layer of material in proximity to the lower surface.

14. The method of claim 13, where the step of forming the layer of material comprises forming a silicon nitride layer having a thickness of about 0.01 microns to about 0.05 microns, and where step of forming the non-conformal layer of material comprises depositing a silicon oxide using PECVD with a silane source gas.

15. The method of claim 12, where the step of forming the first spacer layers comprises the steps of:
forming a layer of material adjacent the first dielectric layer;
forming polycrystalline semiconductor spacers adjacent the layer of material; and
removing portions of the layer of material in proximity to the lower surface.

16. The method of claim 12, where the step of removing portions of the first dielectric layer from the lower surface adjacent the first spacer layers and the region of semiconductor material comprises removing portions of the first dielectric layer adjacent lower sidewall surfaces of the trench to form undercut portions, and where the step of forming the first dielectric region comprises forming the first dielectric region within the undercut portions and adjacent the lower sidewall surfaces, and where the step of forming the first conductive region comprises forming a shield electrode, and where the step of forming the second conductive region comprising forming a gate electrode, and where the method further comprises the steps of:
forming a body region adjacent the trench; and
forming a source region within the body region and adjacent trench.

17. A method for forming a semiconductor device comprising:
providing a region of semiconductor material having a major surface;
forming a trench extending from the major surface;
forming a first layer overlying surfaces of the trench;
forming a spacer layer adjacent the first layer, where the spaces layer comprises a material different than the first layer;
removing portions of the first layer underlying the spacer layer to form undercut portions between the region semiconductor material and the spacer layer;
forming a first region comprising a material different than the spacer layer in proximity to a lower surface of the trench and within the undercut portions;

forming a first electrode in a lower portion of the trench and adjacent portions of the spacer layer and the first region;

forming a dielectric layer above the first electrode; and forming a second electrode adjacent the first layer and the dielectric layer, where at least a portion of the second electrode is within the trench.

18. The method of claim 1 further comprising:

forming a body region adjoining the trench; and forming a source region adjoining the trench and a central portion adjoining the extension portion, and where the central portion is shallower than the extension portion, and where forming the first layer comprises forming a gate dielectric layer, and where forming the first electrode includes forming a shield electrode having a stepped shape such that the first electrode decreases in width and is narrower in proximity to the lower surface of the trench, and where forming the second electrode includes forming a gate electrode.

19. The method of claim 1, where forming the spacer layer includes:

forming a second layer adjacent the first layer;

forming a non-conformal layer overlying the major surface and adjacent the second layer, where the non-conformal layer is thicker in proximity to upper surfaces of the trench;

removing portions of the non-conformal layer and second layer in proximity to the lower surface of the trench.

20. The method of claim 17 further comprising forming a polycrystalline semiconductor spacer layer adjacent the spacer layer before forming the first region.

21. A method for forming a semiconductor device comprising:

providing a region of semiconductor material having a major surface and a trench extending from the major surface;

forming a first dielectric layer overlying surfaces of the trench;

forming a second dielectric layer adjacent the first dielectric layer, wherein the second dielectric layer comprises a material different than the first dielectric layer, and where the second dielectric layer is discontinuous in proximity to the lower surface of the trench;

removing portions of the first dielectric layer underlying the second dielectric layer to form undercut portions between the region of semiconductor material and the spacer layer;

forming a dielectric region in proximity to a lower surface of the trench and within the undercut portions, wherein at least portions of the first dielectric layer, the second dielectric layer and the dielectric region are configured as a shield isolation structure;

forming a shield electrode on the shield isolation structure; and forming an insulated gate electrode in the trench above the shield electrode.

22. The method of claim 21, further comprising forming a third dielectric layer in the trench, wherein the third dielectric separates at least in part the shield electrode from the second dielectric layer.

* * * * *